(12) United States Patent
Endo

(10) Patent No.: US 6,731,144 B2
(45) Date of Patent: May 4, 2004

(54) DELAY LOCK LOOP CIRCUIT, VARIABLE DELAY CIRCUIT, AND RECORDING SIGNAL COMPENSATING CIRCUIT

(75) Inventor: Masaki Endo, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/084,789

(22) Filed: Feb. 25, 2002

(65) Prior Publication Data

US 2002/0118054 A1 Aug. 29, 2002

(30) Foreign Application Priority Data

Feb. 26, 2001 (JP) ........................................ 2001-050433
May 31, 2001 (JP) ........................................ 2001-163818

(51) Int. Cl.[7] ................................................ H03L 7/00
(52) U.S. Cl. ........................................ 327/151; 327/160
(58) Field of Search ................................ 327/149, 150, 327/151, 152, 153, 158, 159, 160, 161

(56) References Cited

U.S. PATENT DOCUMENTS

| 5,309,483 | A | * | 5/1994 | Oliboni et al. | ............... | 375/355 |
| 6,044,055 | A | | 3/2000 | Hara | ........................ | 369/111 |
| 6,064,244 | A | * | 5/2000 | Wakayama et al. | ......... | 327/158 |
| 6,294,938 | B1 | * | 9/2001 | Coddington et al. | ........ | 327/158 |
| 6,504,408 | B1 | * | 1/2003 | von Kaenel | ................. | 327/158 |

FOREIGN PATENT DOCUMENTS

| JP | 10 091961 | 4/1998 |
| JP | 2000 134072 | 5/2000 |

\* cited by examiner

*Primary Examiner*—Tuan T. Lam
(74) *Attorney, Agent, or Firm*—Frommer Lawrence & Haug LLP; William S. Frommer

(57) ABSTRACT

The present invention is intended to provide a delay lock loop circuit which is capable of providing a minute delay amount with stability regardless of the variations in delay amount due to variations in temperature and power supply voltage for example and process conditions. On the basis of a up/down control signal from a delay amount detector, count value is counted from initial setting value up to maximum setting value or down to minimum setting value. When the count value has reached the maximum or minimum value, another count value is counted up and down, thereby cutting the noise component of the up/down control signal. Consequently, regardless of the variation in delay amount due to a delay line, a delay lock detector to which the latter count value is supplied operates normally, thereby outputting with stability a reference delay step count for obtaining a delay of 1T.

4 Claims, 18 Drawing Sheets

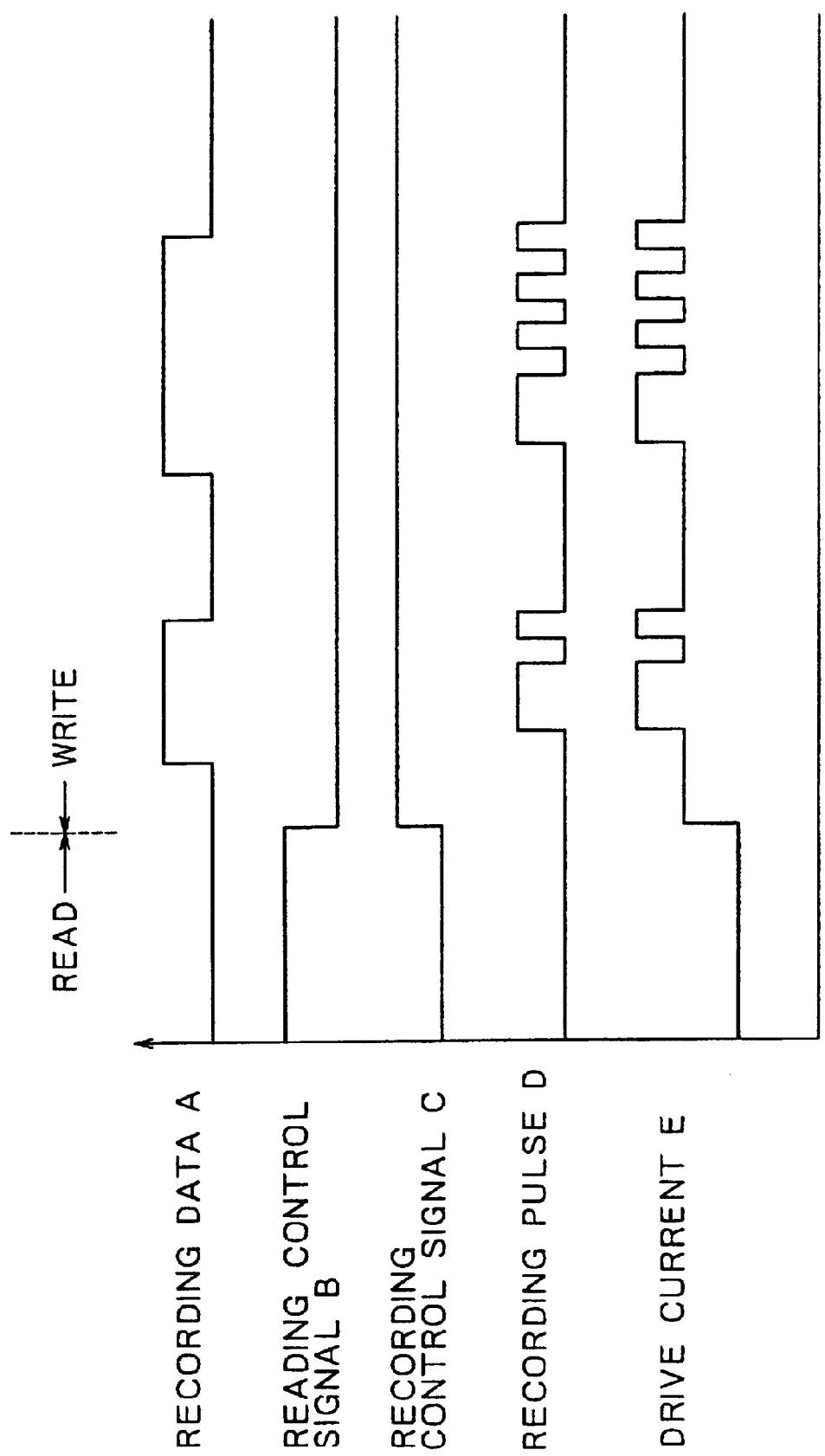

DELAY LOCK LOOP CIRCUIT, VARIABLE DELAY CIRCUIT, AND RECORDING SIGNAL COMPENSATING CIRCUIT

BACKGROUND OF THE INVENTION

The present invention relates to a delay lock loop circuit for providing a desired signal delay amount, a variable delay circuit having the delay lock loop circuit, and a recording signal compensating circuit having this variable delay circuit.

Optical-disk-based high-density recording systems under development include a magneto-optical disk system and a phase change optical disk system. In the latter, information is recorded by changing a recording layer to a crystalline phase or an amorphous phase. Recently trend is a particular emphasis on the development of this phase change optical disk system because of its ease of making the optical head smaller because no magnetic head is used, its ease of realizing direct overwriting by which information can be recorded by a single laser irradiation regardless of the presence or absence of marks on the recording surface, and its ease of increasing the S/N (Signal to Noise) ratio of the reproduction system due to a high signal strength, for example.

In a high-density optical disk system, microscopic mark trains must be recorded in correct positions. In the case of the phase change optical disk, signal recording is pure thermal recording, so that heat control at recording is very important for the correct formation of marks. For example, if a recording-level laser is irradiated for a relatively long time to form a comparatively long mark, the formed mark becomes wider toward its end in the disk radius direction due to the thermal storage effect of the recording film. If such a mark is formed, the edge of the trailing end is offset from an ideal position, resulting in an increased error rate. For this reason, the phase change optical disk system uses continuous pulse trains as a laser for mark formation for the thermal control at recording. Also, it is essential for the phase change optical disk system to perform so-called recording compensation to optimally set not only the pulses synchronized with clock but also the position and width of each mark.

One example of the data recording apparatus which performs such recording compensation is disclosed in Japanese Patent Laid-open No. Hei 10-091961. In this disclosure, recording pulses are generated in which a leading pulse having length 1.5T is followed by a pulse train synchronized with clock, thereby lowering the amount of irradiation in the last half of each mark to prevent its width from getting larger. However, this makes the end portion of each mark thermally unstable, sometimes failing to form marks at correct positions. To prevent this problem from happening, the rising edge position and the falling edge position of pulse are delayed to vary the pulse widths of the leading pulse and the trailing pulse. In the disclosed data recording apparatus, such recording pulse B is obtained by a normal logic circuit and a recording compensation circuit based on a delay element of variable delay amount type.

For a delay element for delaying an input signal, an all-pass filter formed by an LC (inductor and capacitor) or a distribution constant circuit for example is known. The delay element of delay amount variable type includes one in which two or more LC delay elements are connected in series, selecting the output from each element by a selector. The delay element having his configuration can provide a comparatively stable delay amount, but presents a problem of significantly increasing the element unit price as compared with the ICs (Integrated Circuits) based on CMOS (Complementary Metal-Oxide Semiconductor) process if the element itself grows in dimension, thereby requiring a larger packaging area. Also, a method is available in which the delay element of delay amount variable type which can be incorporated in a CMOS IC for example is realized by use of the frequency multiplication capability of PLL (Phase-Locked Loop). This method can solve the problem of the large packaging area by incorporating the delay element in the IC but still presents a problem of the increased cost due to the PLL incorporation.

On the other hand, developed with application to digital integrated circuits such as gate arrays and embedded arrays in mind is a delay element realized by positively using the signal propagation delay time in CMOS logic by use of a combination of buffers formed by inverter and NAND gate. Such a delay circuit is obtained by connecting delay lines with two steps of inverters connected in series by the number of steps in series so that a desired delay amount is obtained, for example. The delay circuit having this structure can be configured by basic logic elements, so that it can be easily incorporated in a CMOS IC, thereby involving little increase in packaging area and cost. At the same time, the delay amount generated by the gates inside the IC fluctuates as largely as three times depending on the fluctuations in temperature and supply voltage and the process conditions for example.

For the purpose of solving the above-mentioned problems of CMOS-logic-based delay circuits, a variable delay circuit is disclosed in Japanese Patent Laid-open No. Hei 2000-134072 in which a delay lock loop circuit is used to adjust the number of delay line steps for obtaining a delay amount for 1T. Now, referring to FIG. 15, there is shown a block diagram illustrating an exemplary configuration of a delay lock loop circuit used in the disclosed variable delay circuit.

A delay lock loop circuit 40 shown in FIG. 15 includes a divider 41 for dividing an input pulse into a predetermined frequency and outputting the resultant pulse, a delay line 42 capable of providing a desired delay amount by varying the number of delay steps, a delay amount detector 43 for determining which of input pulses has come first and, on the basis of the decision, outputting a control signal, an up/down counter (hereafter referred to as a U/D counter) 44 for controlling the number of delay steps in the delay line 42 in accordance with this control signal, and a delay lock detector 45 for outputting the number of delay steps which provide the amount of delay of 1T provided by the delay line 42 with reference to the output signal of the U/D counter 44.

The divider 41 generates data pulse TP of 1T obtained by dividing inputted clock CLK by 2, data pulse TP2 of 2T obtained by dividing CLK by 4, and data pulse TP4 of 4T obtained by dividing CLK by 8. The delay line 42 is a signal delay circuit which is formed by two inverters for example connected in series which are connected in series by the required number of steps, thereby providing variable delay amounts. With count value SEL of the U/D counter 44 used as the setting data for the number of delay steps, the delay line 42 delays, by 1T, data pulse TP supplied from the divider 41. The delay amount detector 43 outputs, on the basis of data pulse DTP delayed by the delay line 42 and data pulse TP2 supplied from the divider 41, an up/down control signal (hereafter referred to as a U/D control signal) UD for controlling the count-up and count-down operations of the U/D counter 44.

Referring FIG. 16, there is shown a circuit diagram illustrating an exemplary circuit configuration of the delay amount detector 43.

The delay amount detector 43 includes a D flip-flop (hereafter referred to as a D-FF) 431 forming an input stage, an exclusive OR gate (hereafter referred to as an EOR gate) 432, an inverter 433, and a D-FF 434 forming an output stage. In this delay amount detector 43, the D-FF 431 latches data pulse TP2 supplied from the divider 41 on the basis of data pulse DTP outputted from the delay line 42 to determine which of the rising of data pulse DTP delayed by 1T by the delay line 42 and the inversion of data pulse TP2 providing reference of timing for delay amount 1T has come first. On the basis of the result of the decision, the delay amount detector 43 outputs, from the D-FF 434, a U/D control signal UD as a control signal for selecting the increase or decrease in the number of delay steps. The outputted U/D control signal UD is logically high if the rising of data pulse TP2 is earlier than the rising of data pulse DTP and logically low if otherwise.

Returning to FIG. 15, on the basis of the U/D control signal UD from the delay amount detector 43, the U/D counter 44 counts up or down the number of delay steps and outputs count value SEL, thereby controlling the number of delay steps for delay amount 1T given by the delay line 42. The delay lock detector 45 makes comparison between the number of delay steps at the current point of time, the number of delay steps one clock before, and the number of delay steps two clocks before in a timed relation with data pulse TP4 from the divider 41 and on the basis of count value SEL from the U/D counter 44, thereby outputting delay lock signal LOCK indicative of whether or not the number of delays steps is locked and reference delay step count DREF for obtaining 1T delay by the delay line 42. Now, in relation to the current number of delay steps, namely current count value SEL from the U/D counter 44, let the number of delay steps one clock before and two clocks before of data pulse TP4, which is clock input CK, be SEL1 and SEL2 respectively, then, if SEL=SEL2, delay clock signal LOCK is logically high; otherwise, it is logically low. If SEL=SEL2 or if SEL>SEL1, then SEL1 is outputted as reference delay step count DREF; otherwise, current count value SEL is outputted.

Referring to FIG. 17, there is shown a timing chart indicative of the behaviors of various signals in the delay lock loop circuit 40.

As shown in FIG. 17, in a period between 900 ns and 1100 ns, the delay amount due to the gate constituting the delay line 42 fluctuates due to the fluctuations in temperature and supply voltage for example. At this moment, because the delay amount due to count value SEL indicative of the number of delay steps in the delay line 42 falls short for the delay for 1T, count value SEL from the U/D counter 44 and reference delay step count DREF are each counted up by one 1, turning delay lock signal LOCK logically low.

In 1100 ns timing, the inverted timing of data pulse TP2 inputted in the delay amount detector 43 becomes earlier than the rising of data pulse DTP and therefore the U/D control signal UD to be outputted goes logically low, thereby counting down count value SEL of the U/D counter 44. Subsequently, at the rising of data pulse TP4, the U/D control signal UD alternately repeats logically high and logically low, causing count value SEL of the U/D counter 44 to take "29" and "28" alternately. In 1050 ns timing, the delay lock detector 45 detects a match in "29" between current count value SEL and count value SEL2 two clocks before based on data pulse TP4, causing delay lock signal LOCK to go logically high. Consequently, the value of reference delay step count DREF delayed by 1T by the delay line 42 is fixed to "28," thereby locking the operation of the delay lock loop circuit 40.

In the above-mentioned variable delay circuit based on the delay lock loop circuit 40, the ratio of a delay amount to the width of 1T pulse is set as required, the ratio is multiplied with the value of reference delay step count DREF, and the multiplication result is set as a delay setting step count to a delay line configured in the same manner as the delay line 42, thereby delaying the inputted data pulse. Consequently, the variable delay circuit based on the delay lock loop circuit 40 is able to always provide desired delay amounts even if the amount of delay by the gate forming a delay line is varied due to the fluctuation in temperature and supply voltage, regardless of the amount of the variation. Therefore, in the above-mentioned phase change optical disk system, the above-mentioned variable delay circuit is used to correctly delay, by a desired amount, the rising position at the leading end of a recording pulse and the falling position at the trailing end, thereby correctly controlling the outline of each mark formed on the disk.

In the above-mentioned delay lock loop circuit 40 overcomes the defects of the delay line caused by the CMOS gate and provides delay amounts at low cost and with stability, thereby being realized as an IC for the recording compensation for optical disk drives. However, in the actual operation by the delay lock loop circuit 40, a phenomenon is observed that count value SEL outputted from the U/D counter 44 is not plus/minus 1 step even in a state where reference delay step count DREF is almost stable, thereby repeating an irregular variation with a width of several steps.

Referring to FIG. 18, there is shown a timing chart indicative of the timings of various signals in the delay lock loop circuit 40 which are observed if the above-mentioned abnormal operation takes place.

As shown in FIG. 18, a period up to 1670 ns, reference delay step count DREF is locked to "28." However, at timings of 1670 ns, 1770 ns, and 1870 ns, the U/D control signal UD becomes logically high, continuously counting up count value SEL. Hence, by the detection by the delay lock detector 45, delay lock signal LOCK goes logically low. Subsequently, count value SEL is counted up to value "2b" and counted down to value "28," thereby locking the operation of the delay lock loop circuit 40 again at timing of 2250 ns.

The above-mentioned irregular variation of reference delay step count DREF is thought of as due to the D-FF 431 used in the delay amount detector 43. In the timing comparison in the delay amount detector 43, Q output namely phase comparison intermediate signal QA is outputted on the basis of which of the rising of data pulse DTP of clock input CK in the D-FF 431 and the inversion of data pulse TP2 of data input D takes place first, executing an exclusive OR operation between phase comparison intermediate signal QA and data pulse TP2 in the EOR gate 432 to output phase comparison signal UP. However, if the rising of clock input CK and the inversion of data input D in the D-FF 431 are inputted successively in a time shorter than the minimum setup time and hold time of the D-FF 431, phase comparison intermediate signal QA to be inputted is not settled, thereby causing a short-period disturbance in the outputted U/D control signal UD.

It should be noted that the case in which the rising of clock input CK and the inversion of data input D take place substantially at the same time denotes that the delay amount between data pulse TP and data pulse DTP due to the delay line 42 matches 1T. In the delay lock loop circuit 40, control is executed so that above-mentioned state is always maintained, so it is assumed that the state in which phase comparison intermediate signal QA is unstable takes place at a high rate when the operation of the delay lock loop circuit 40 is almost locked. The U/D control signal UD at the timings of 1770 ns and 1870 ns shown in FIG. 18 is thought of as a noise component that takes place in the above-mentioned case. This noise component irregularly varies count value SEL of the U/D counter 44 without counting up and down alternately; consequently the value of reference delay step count DREF is not locked, being varied without stability with a magnitude of plus/minus several steps.

Consequently, with the variable delay circuit based on the delay lock loop circuit 40, in setting the number of delay steps in a delay line, if reference delay step count DREF is multiplied by ½ to obtain a delay of T/2, reference delay step count DREF does not become constant, so that a jitter is generated in the output signal of the delay line.

SUMMARY OF THE INVENTION

It is therefore an object of the present invention to provide a delay lock loop circuit for providing stable delay amounts regardless of the variation in delay amount due to the fluctuation in temperature and supply voltage and process conditions if a delay circuit which is low in cost and small in packaging area is used in this delay lock loop circuit.

It is another object of the present invention to provide a variable delay circuit based on a delay circuit which is low in cost and small in packaging area for providing stable delay amounts regardless of the variation in delay amount due to the fluctuation in temperature and supply voltage and process conditions.

It is still another object of the present invention to provide a recording signal compensating circuit based on a delay circuit which is low in cost and small in packaging area for correctly delaying recording pulses when recording data to a disk storage medium.

According to the first aspect of the present invention, there is provided a delay lock loop circuit including:

a dividing means for generating, on a clock signal, first pulse data, second pulse data having a period greater than that of the first pulse data, and third pulse data having a period greater than that of the second pulse data;

an up/down counter having a sub counter, to a count value of which an initial value, a maximum value, and a minimum value are set, the sub counter executing at least one of a count-up operation and a count-down operation on the basis of up/down control signal at a rising edge of the third pulse data and, when the count value has reached the maximum value and the minimum value, setting a next count value to the initial value, the up/down counter executing a count-up operation at a rising edge of the third pulse data when the count value of the sub counter is the maximum value and a count-down operation when the count value is the minimum value;

a delay means for delaying the first pulse data in accordance with the number of delay steps based on a count output of the up/down counter;

a delay amount detecting means for determining which of a rising edge of the second pulse data and a rising edge of an output pulse of the delay means comes first and outputting, on the basis of a result of this determination, the up/down control signal; and a delay lock detecting means for comparing a current count value with a past count value of the up/down counter at a rising edge of the third pulse data to determine whether or not a delay amount is locked, selecting one of the current count value and the past count value, and outputting the selected count value as a reference delay step count.

According to the second aspect of the present invention, there is provided A variable delay circuit including:

a reference delay step count output means having a dividing means for generating, on a clock signal, first pulse data, second pulse data having a period greater than that of the first pulse data, and third pulse data having a period greater than that of the second pulse data, an up/down counter having a sub counter, to a count value of which an initial value, a maximum value, and a minimum value are set, the sub counter executing at least one of a count-up operation and a count-down operation on the basis of up/down control signal at a rising edge of the third pulse data and, when the count value has reached the maximum value and the minimum value, setting a next count value to the initial value, the up/down counter executing a count-up operation at a rising edge of the third pulse data when the count value of the sub counter is the maximum value and a count-down operation when the count value is the minimum value, a first delay means for delaying the first pulse data in accordance with the number of delay steps based on a count output of the up/down counter, a delay amount detecting means for determining which of a rising edge of the second pulse data and a rising edge of an output pulse of the first delay means comes first and outputting, on the basis of a result of this determination, the up/down control signal, and a delay lock detecting means for comparing a current count value with a past count value of the up/down counter at a rising edge of the third pulse data to determine whether or not a delay amount is locked, selecting one of the current count value and the past count value, and outputting the selected count value as a reference delay step count;

a delay step count setting means, to which the clock signal is supplied, for multiplying the reference delay step count with a delay rate; and a second delay means, configured in substantially a same manner as the first delay means, for delaying inputted data on the basis of a delay step count set by the delay step count setting means.

According to the third aspect of the present invention, there is provided A recording signal compensating circuit for recording data to a disk recording medium in accordance with a recording pulse obtained by synthesizing a leading pulse, a burst pulse, and a trailing pulse, including:

a reference delay step count output means having a dividing means for generating, on a clock signal, first pulse data, second pulse data having a period greater than that of the first pulse data, and third pulse data having a period greater than that of the second pulse data, an up/down counter having a sub counter, to a count value of which an initial value, a maximum value, and a minimum value are set, the sub counter executing at least one of a count-up operation and a count-down operation on the basis of up/down control signal at a rising edge of the third pulse data and, when the count value has reached the maximum value and the minimum value, setting a next count value to the initial value, the up/down counter executing a count-up operation at a rising edge of the third pulse data when the count value of the sub counter is the maximum value and a count-down operation when the count value is the minimum value, a first delay means for delaying the first pulse data in accordance with the number of delay steps based on a count output of the up/down counter, a delay amount detecting means for determining which of a rising edge of the second pulse data and a rising edge of an output pulse of the first delay means comes first and outputting, on the basis of a result of this determination, the up/down control signal, and a delay lock detecting means for comparing a current count value with a past count value of the up/down counter at a rising edge of the third pulse data to determine whether or not a delay amount is locked, selecting one of the current count value and the past count value, and outputting the selected count value as a reference delay step count;

a delay step count setting means to which the clock signal is supplied, for multiplying the reference delay step count with a delay rate;

a second delay means, configured in substantially a same manner as the first delay means, for delaying inputted data on the basis of a delay step count set by the delay step count setting means;

a leading pulse varying means for varying a pulse width of the leading pulse by delaying a leading edge position of the leading pulse; and a trailing pulse varying means for varying a pulse width of the trailing pulse by delaying a trailing edge position of the trailing pulse.

According to the fourth aspect of the present invention, there is provided A delay lock loop circuit including:

a dividing means for generating, on a clock signal, first pulse data, second pulse data having a period greater than that of the first pulse data, and third pulse data having a period greater than that of the second pulse data;

an up/down counter having a first counter for executing a count-up operation at a rising edge of the third pulse data and, if a count value has exceeded a preset value M (an integer higher than 0), outputting a reset signal and resetting the count value, a second counter for executing a count-up operation only when an up/down control signal is logically high at a rising edge of the third pulse data and resetting a count value when the reset signal is inputted, and a third counter for executing a count-up operation only when the up/down control signal is logically low at a rising edge of the third pulse data and resetting a count value when the reset signal is inputted, the up/down counter executes, when the reset signal is inputted, a count/up operation if the count value obtained by the second counter is higher than preset value N (an integer higher than 0 and lower than M) and a count-down operation if the count value obtained by the third counter is higher than the preset value N;

a delay means for delaying the first pulse data in accordance with the number of delay steps based on a count output of the up/down counter;

a delay amount detecting means for determining which of a rising edge of the second pulse data and a rising edge of an output pulse of the delay means comes first and outputting, on the basis of a result of this determination, the up/down control signal; and a delay lock detecting means for comparing a current count value with a past count value of the up/down counter at a rising edge of the third pulse data to determine whether or not a delay amount is locked, selecting one of the current count value and the past count value, and outputting the selected count value as a reference delay step count.

According to the fifth aspect of the present invention, there is provided A variable delay circuit including:

a reference delay step count outputting means having a dividing means for generating, on a clock signal, first pulse data, second pulse data having a period greater than that of the first pulse data, and third pulse data having a period greater than that of the second pulse data, an up/down counter having a first counter for executing a count-up operation at a rising edge of the third pulse data and, if a count value has exceeded a preset value M (an integer higher than 0), outputting a reset signal and resetting the count value, a second counter for executing a count-up operation only when an up/down control signal is logically high at a rising edge of the third pulse data and resetting a count value when the reset signal is inputted, and a third counter for executing a count-up operation only when the up/down control signal is logically low at a rising edge of the third pulse data and resetting a count value when the reset signal is inputted, the up/down counter executes, when the reset signal is inputted, a count/up operation if the count value obtained by the second counter is higher than preset value N (an integer higher than 0 and lower than M) and a count-down operation if the count value obtained by the third counter is higher than the preset value N, a first delay means for delaying the first pulse data in accordance with the number of delay steps based on a count output of the up/down counter, a delay amount detecting means for determining which of a rising edge of the second pulse data and a rising edge of an output pulse of the first delay means comes first and outputting, on the basis of a result of this determination, the up/down control signal, and a delay lock detecting means for comparing a current count value with a past count value of the up/down counter at a rising edge of the third pulse data to determine whether or not a delay amount is locked, selecting one of the current count value and the past count value, and outputting the selected count value as a reference delay step count;

a delay step count setting means, to which the clock signal is supplied, for multiplying the reference delay step count with a delay rate; and a second delay means, configured in substantially a same manner as the first delay means, for delaying inputted data on the basis of a delay step count set by the delay step count setting means.

According to the sixth aspect of the present invention, there is provided A recording signal compensating circuit for recording data to a disk recording medium in accordance with a recording pulse obtained by synthesizing a leading pulse, a burst pulse, and a trailing pulse, including:

a reference delay step count output means having a dividing means for generating, on a clock signal, first pulse data, second pulse data having a period greater than that of the first pulse data, and third pulse data having a period greater than that of the second pulse data, an up/down counter having a first counter for executing a count-up operation at a rising edge of the third pulse data and, if a count value has exceeded a preset value M (an integer higher than 0), outputting a reset signal and resetting the count value, a second counter for executing a count-up operation only when an up/down control signal is logically high at a rising edge of the third pulse data and resetting a count value when the reset signal is inputted, and a third counter for executing a count-up operation only when the up/down control signal is logically low at a rising edge of the third pulse data and resetting a count value when the reset signal is inputted, the up/down counter executes, when the reset signal is inputted, a count/up operation if the count value obtained by the second counter is higher than preset value N (an integer higher than 0 and lower than M) and a count-down operation if the count value obtained by the third counter is higher than the preset value N, a first delay means for delaying the first pulse data in accordance with the number of delay steps based on a count output of the up/down counter, a delay amount detecting means for determining which of a rising edge of the second pulse data and a rising edge of an output pulse of the first delay means comes first and outputting, on the basis of a result of this determination, the up/down control signal, and a delay lock detecting means for comparing a current count value with a past count value of the up/down counter at a rising edge of the third pulse data to determine whether or not a delay amount is locked, selecting one of the current count value and the past count value, and outputting the selected count value as a reference delay step count;

a delay step count setting means, to which the clock signal is supplied, for multiplying the reference delay step count with a delay rate;

a second delay means, configured in substantially a same manner as the first delay means, for delaying inputted data on the basis of a delay step count set by the delay step count setting means;

a leading pulse varying means for varying a pulse width of the leading pulse by delaying a leading edge position of the leading pulse; and a trailing pulse varying means for varying a pulse width of the trailing pulse by delaying a trailing edge position of the trailing pulse.

BRIEF DESCRIPTION OF THE DRAWINGS

These and other objects of the present invention will be seen by reference to the description, taken in connection with the accompanying drawing, in which:

FIG. 11 is a timing chart indicative of waveforms representative of various signals and currents to be outputted at signal recording;

DETAILED DESCRIPTION OF PREFERRED EMBODIMENTS

The present invention will be described in further detail by way of example with reference to the accompanying drawings. Now, referring to FIG. 1, there is shown an exemplary configuration of a delay lock loop circuit practiced as one embodiment of the present invention.

Figure 1:
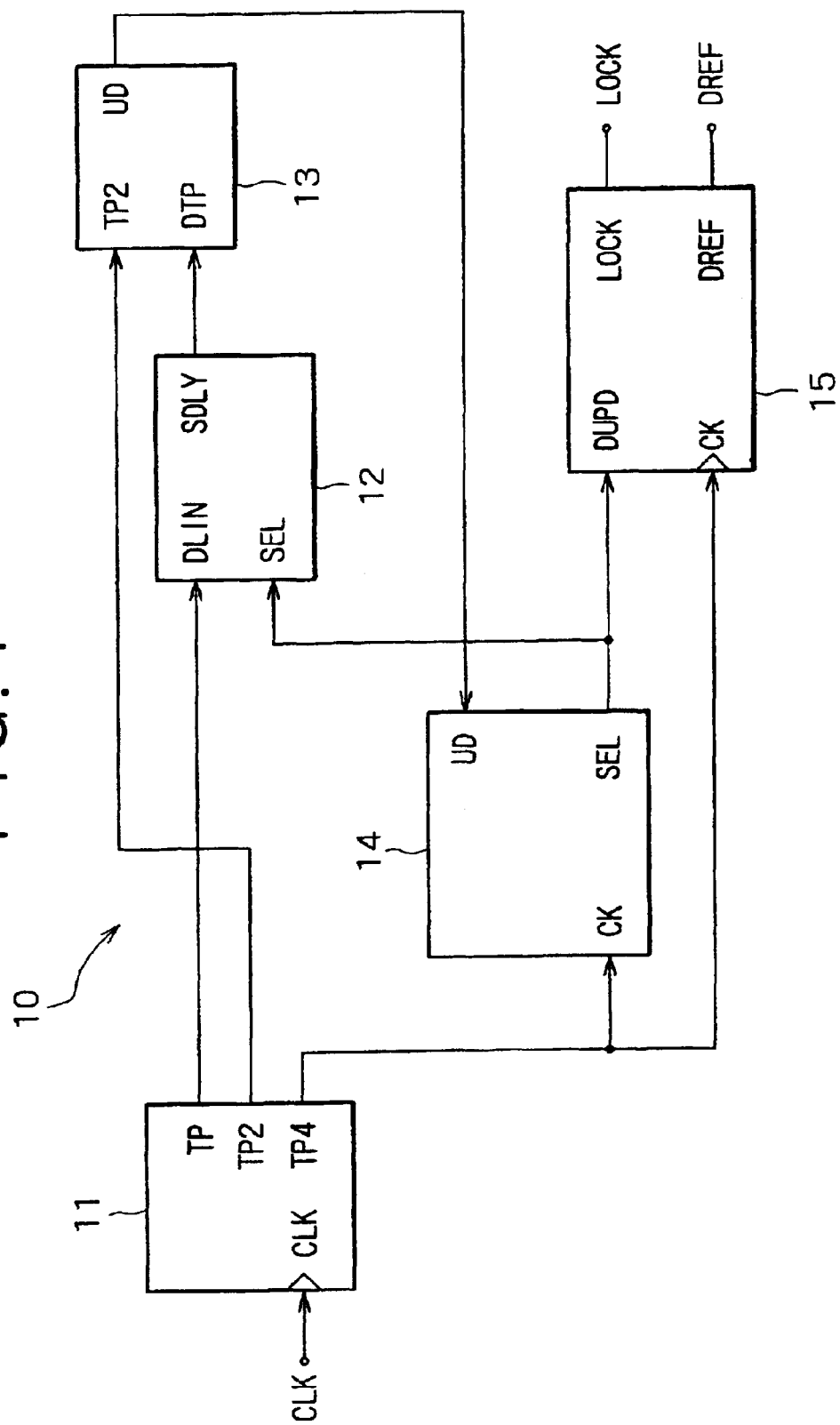
FIG. 1 is a block diagram illustrating an exemplary configuration of a delay lock loop circuit according to the present invention.

A delay lock loop circuit 10 shown in FIG. 1 includes a divider 11 for dividing an input pulse into a predetermined frequency and outputting the resultant pulse, a delay line 12 capable of providing a desired delay amount by varying the number of delay steps, a delay amount detector 13 for determining the order of the arrival of input pulses and outputting a control signal based on the determination, an up/down counter (hereafter referred to as a U/D counter) 14 for controlling the number of delay steps in the delay line 12 in accordance with the control signal, and a delay lock detector 15 for outputting the number of delay steps which provides the amount of delay of 1T provided by the delay line 12 with reference to the output signal of the U/D counter 14.

The divider 11 generates data pulse TP of 1T obtained by dividing inputted clock CLK by 2, data pulse TP2 of 2T obtained by dividing CLK by 4, and data pulse TP4 of 4T obtained by dividing CLK by 8. The delay line 12 is a signal delay circuit which is formed such that unit delay elements each formed by connecting two inverters in series are connected in series by the required number of steps. The delay line 12 provides variable delay amounts by selecting the number of steps. The signal delay circuit may be implemented by CMOS logic for example. With count value SEL of the U/D counter 14 used as the setting data for the number of delays steps, the delay line 12 delays, by 1T, data pulse TP supplied from the divider 11. The delay amount detector 13 outputs, on the basis of data pulse DTP delayed by the delay line 12 and data pulse TP2 supplied from the divider 11, an up/down control signal UD for controlling the count-up and count-down operations of count value SEL by the U/D counter 14.

Figure 2:
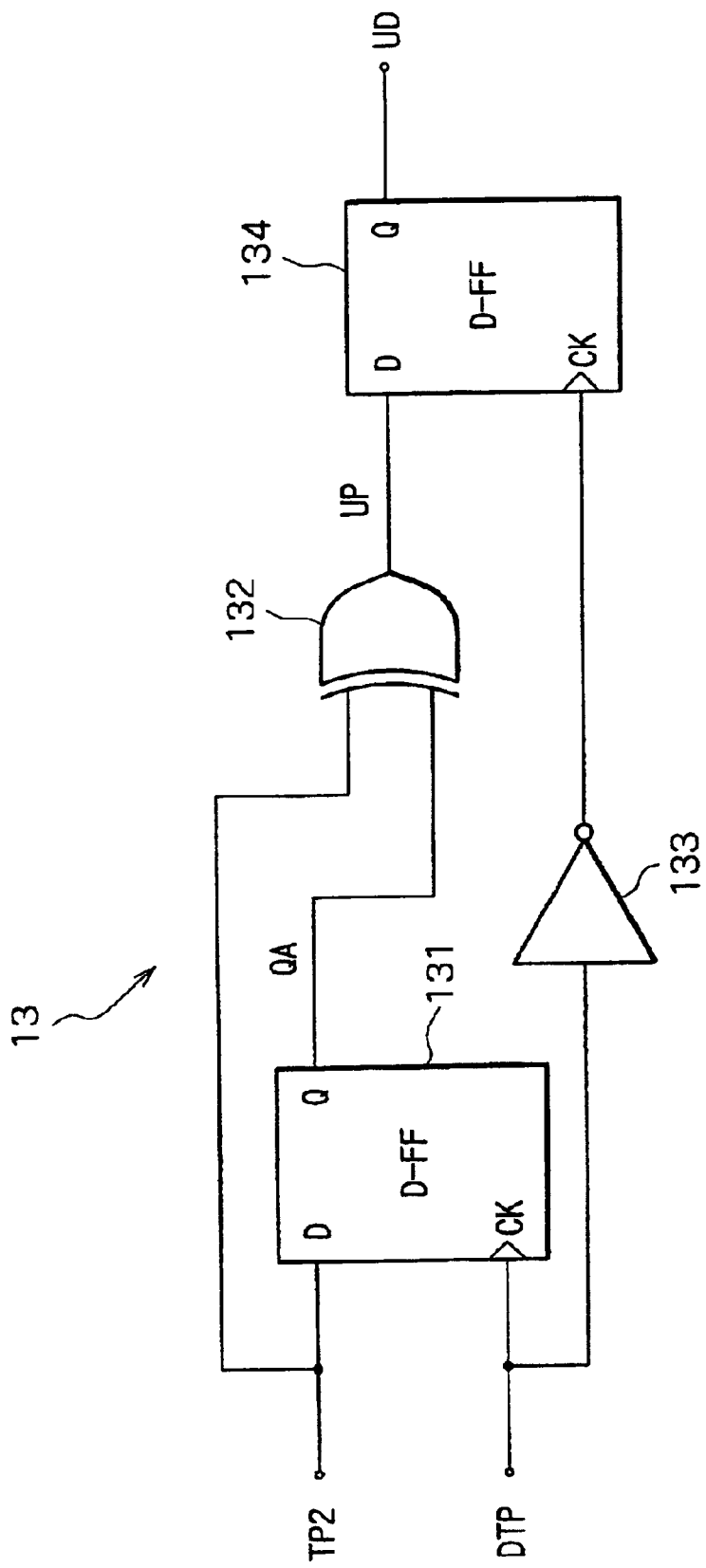
FIG. 2 is a circuit diagram illustrating an exemplary configuration of a delay amount detector shown in FIG. 1.

Referring FIG. 2, there is shown a circuit diagram illustrating an exemplary configuration of the delay amount detector 13.

The delay amount detector 13 includes a D flip-flop (hereafter referred to as a D-FF) 131 forming an input stage, an exclusive OR gate (hereafter referred to as an EOR gate) 132, an inverter 133, and a D-FF 134 forming an output stage. In this delay amount detector 13, the D-FF 131 latches data pulse TP2 supplied from the divider 11 on the basis of data pulse DTP outputted from the delay line 12 to determine which of the rising of data pulse DTP delayed by 1T by the delay line 12 and the inversion of data pulse TP2 providing reference of timing for delay amount 1T has come first. On the basis of the result of the decision, the delay amount detector 13 outputs, from the D-FF 134, a U/D control signal UD as a control signal for selecting the increase or decrease in the number of delay steps. The outputted U/D control signal UD is logically high if the rising of data pulse TP2 is earlier than the rising of data pulse DTP and logically low if otherwise.

Returning to FIG. 1, on the basis of the U/D control signal UD from the delay amount detector 13, the U/D counter 14 counts up or down the number of delay steps and outputs count value SEL, thereby controlling the number of delay steps for delay amount 1T given by the delay line 12. The details of the U/D counter 14 will be described later. A delay lock detector 15 makes comparison between the number of delay steps at the current point of time, the number of delay steps one clock before, and the number of delay steps two clock before in a timed relation with data pulse TP4 from the divider 11 and on the basis of count value SEL from the U/D counter 14, thereby outputting delay lock signal LOCK indicative of whether the number of delays steps is locked and reference delay step count DREF for obtaining 1T delay by the delay line 12. Now, in relation to the current number of delay steps, namely current count value SEL from the U/D counter 14, let the number of delay steps one clock before and two clocks before of data pulse TP4, which is clock input CK, be SEL1 and SEL2 respectively, then, if SEL=SEL2, delay clock signal LOCK is logically high; otherwise, it is logically low. If SEL=SEL2 or if SEL>SEL1, then SEL1 is outputted as reference delay step count DREF; otherwise, current count value SEL is outputted.

As described above, in the timing comparison in the delay amount detector 13, if the rising of data pulse DTP of clock input CK in D-FF 131 and the inversion of data pulse TP2 of data input D are inputted successively in a time shorter than the minimum setup time and hold time of the D-FF 131, phase comparison intermediate signal QA to be inputted is not settled, thereby causing a short-period disturbance in the outputted U/D control signal UD. Therefore, count value SEL of the U/D counter 14 counted on the basis of U/D control signal UD irregularly varies; consequently the value of reference delay step count DREF is not locked, being varied without stability with a magnitude of plus/minus several steps. The present invention overcomes above-mentioned problem by putting the U/D control signal UD outputted from the delay amount detector 13 through a nonlinear counter equivalent in operation with a low-pass filter and then performing the count-up and count-down operations.

Figure 3:
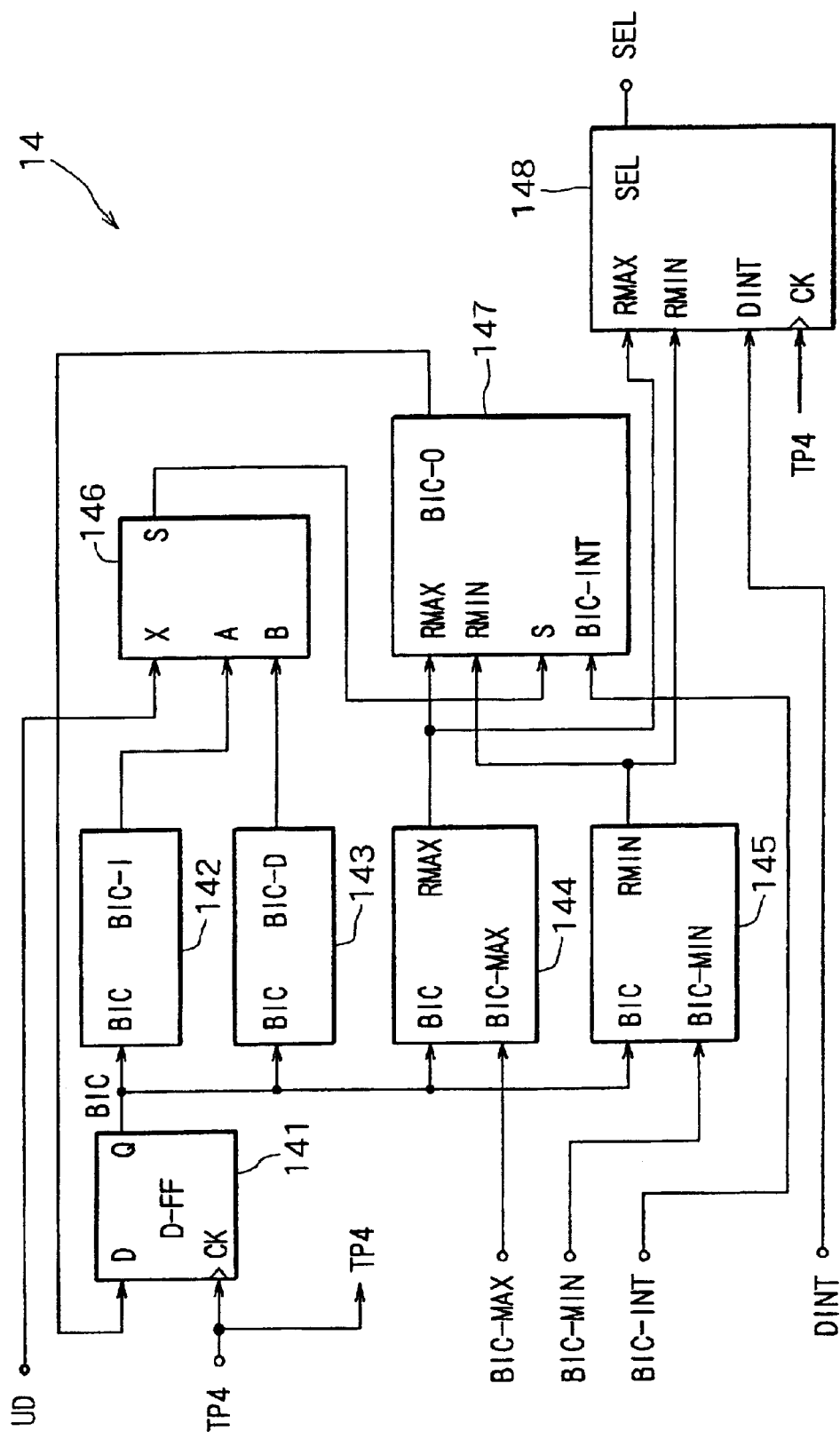
FIG. 3 is a block diagram illustrating a first exemplary configuration of an up/down counter shown in FIG. 1.

The following describes one exemplary configuration of the U/D counter 14 which enables the above-mentioned operation with reference to FIG. 3.

The U/D counter 14 shown in FIG. 3 includes a D flip-flop (hereafter referred to as a D-FF) 141 for holding current count value BIC, an adder 142 for adding 1 to count value BIC, a subtractor 143 for subtracting 1 from count value BIC, a comparator 144 for comparing count value BIC with maximum setting value BIC-MAX and accordingly outputting a reset signal RMAX, a comparator 145 for comparing count value BIC with minimum setting value BIC-MIN and accordingly outputting reset signal RMIN, a selector 146 for selecting input A or B and outputting the selected input as selection output S in accordance with the U/D control signal UD, which is input X, a selector 147 for selecting selection output signal S and initial setting value BIC-INT, and outputting the selected output and value to the D-FF 141 in accordance with inputted reset signals RMAX and RMIN, and a counter 148 for counting up or down count value SEL in accordance with reset signals RMAX and RMIN.

In order to count up and down count value SEL to be outputted, the U/D counter 14 uses the D-FF 141, the adder 142, the subtractor 143, the comparators 144 and 145, and a sub counter constituted by the selectors 146 and 147. For count value BIC of this sub counter, maximum setting value BIC-MAX, which is a maximum value of count up, minimum setting value BIC-MIN, which is a minimum value of count down, and initial value BIC-INT, which becomes an initial value when counting up and down, are set as required. In addition, the for initial value of count value SEL of the counter 148, initial setting value DINT is set.

The D-FF 141 latches selection output BIC-0 from the selector 147 with data pulse TP4 to output count value BIC to the adder 142, the subtractor 143, and the comparators 144 and 145. The selector 146 receives count values BIC-I and BIC-D obtained by adding 1 to count value BIC and subtracting 1 from count value BIC in the adder 142 and the subtractor 143 respectively to output count value BIC-I if the U/D control signal UD from the delay amount detector 13 is logically high and BIC-D if it is logically low to the selector 147 as selection output S. The comparators 144 and 145 output reset signals RMAX and RMIN respectively if the inputted count value BIC is equal to maximum setting value BIC-MAX and minimum setting value BIC-MIN respectively. The selector 147 selects initial setting value BIC-INT if either reset signal RMAX or RMIN is logically high and otherwise selects selection output S received from the selector 146 to output either one of maximum setting value BIC-MAX and selection output S to the D-FF 141 as selection output BIC-0.

Consequently, if the U/D control signal UD is logically high at the rising of data pulse TP4, count value BIC is counted up repeatedly between initial setting value BIC-INT and maximum setting value BIC-MAX, and if the U/D control signal UD is logically low, count value BIC is counted down repeatedly between initial setting value BIC-INT and minimum setting value BIC-MIN. When the U/D control signal UD changes in timing, count value BIC is always set to initial setting value BIC-INT.

The counter 148 counts up count value SEL when reset signal RMAX from the comparator 144 is logically high at the rising of data pulse TP4 and counts down count value SEL when reset signal RMIN from the comparator 145 is logically high. Consequently, when count value BIC has reached count value BIC-MAX from initial setting value BIC-INT, count value SEL is counted up; when count value BIC has reached minimum setting value BIC-MIN from initial setting value BIC-INT, count value SEL is counted down.

Figure 4:
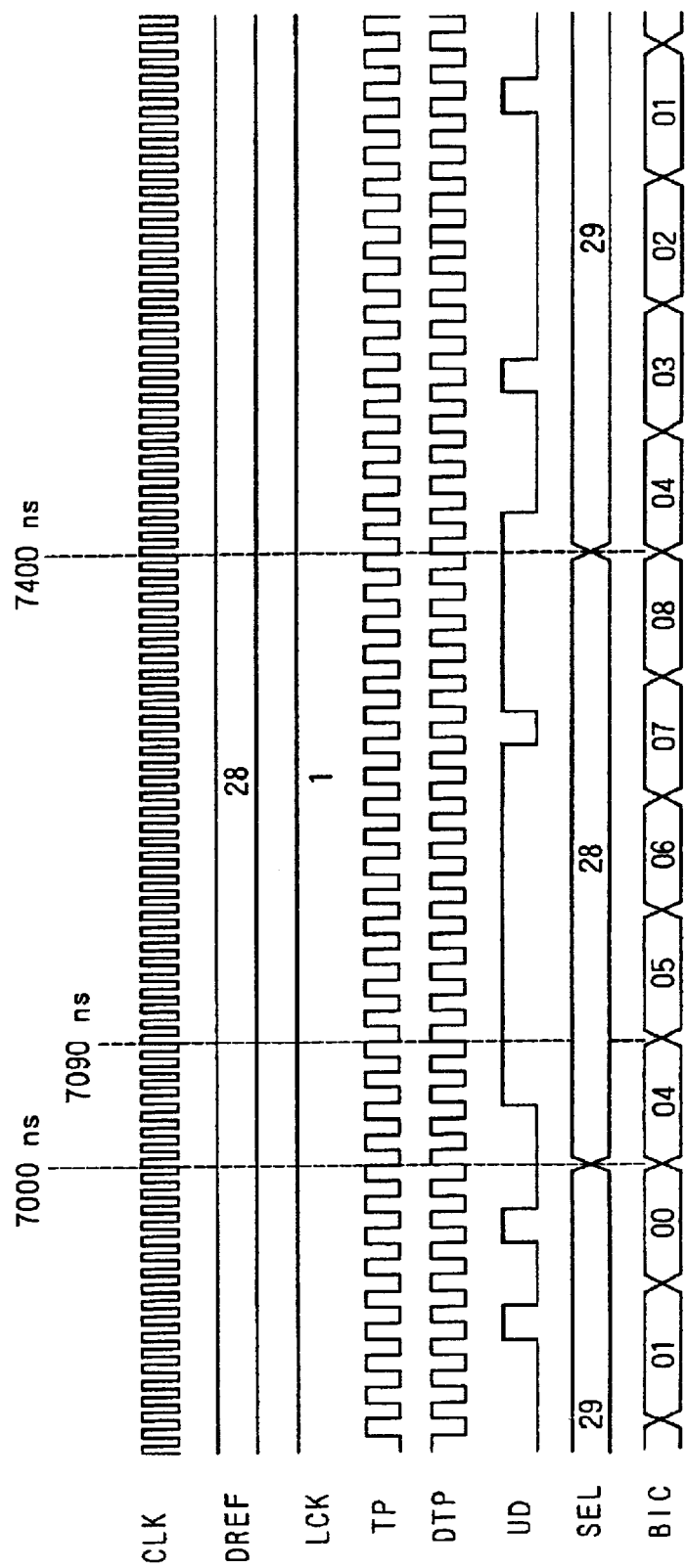
FIG. 4 is a timing chart indicative of the timings of various signals in the delay lock loop circuit shown in FIG. 1.

The following describes the timings of various signals in the delay lock loop circuit 10 having the U/D counter 14 with reference to FIG. 4.

FIG. 4 shows the signal waveforms with no disturbance caused in the U/D control signal UD outputted from the delay amount detector 13. Maximum setting value BIC-MAX, minimum setting value BIC-MIN, and initial setting value BIC-INT in the U/D counter 14 are set to "08," "00," and "04" respectively for example. In FIG. 4, before the timing of 7000 ns, the U/D control signal UD outputted from the delay amount detector 13 at the rising of data pulse TP4 is logically low, so that count value BIC is counted down. At this moment, count value SEL is locked at "29" and reference delay step count DREF is locked at "28." Then, when count value BIC has reached "00" to match minimum setting value BIC-MIN, reset signal RMIN is outputted from the comparator 145 which has detected this matching, upon which the selector 147 selectively outputs "04" which is initial setting value BIC-INT. Consequently, at timing of 7000 ns, count value BIC returns to "04." At the same time, count value SEL is counted down to "28" by the counter 148 on the basis of the input of reset signal RMIN.

During a period between 7000 ns and 7090 ns, the amount of delay by the delay line 12 becomes shorter than 1T by the count-down of count value SEL, so that the U/D control signal UD is turned logically high in the delay amount detector 13. Consequently, the selector 146 outputs a value obtained by adding 1 to count value BIC and the outputted value is outputted from the selector 147, thereby counting up count value BIC to "05" at the timing of 7090 ns. Subsequently, during a period up to the timing of 7400 ns, the U/D control signal UD is almost logically high and count value BIC is counted up to "08" of maximum setting value BIC-MAX. At the timing of 7400 ns, count value returns to "04" of initial setting value BIC-INT and, at the same time, count value SEL is counted up to "29." Immediately thereafter, the amount of delay by the delay line 12 becomes longer than 1T and the U/D control signal UD is turned logically low, thereby counting down count value BIC. Thus, count value BIC alternately repeats count-up and count-down operations around initial setting value BIC-INT, in which count value SEL alternately takes values "28" and "29" to lock the operation of the delay lock loop circuit 10, thereby performing control such that the amount of delay by the delay line 12 is always 1T.

Figure 5:
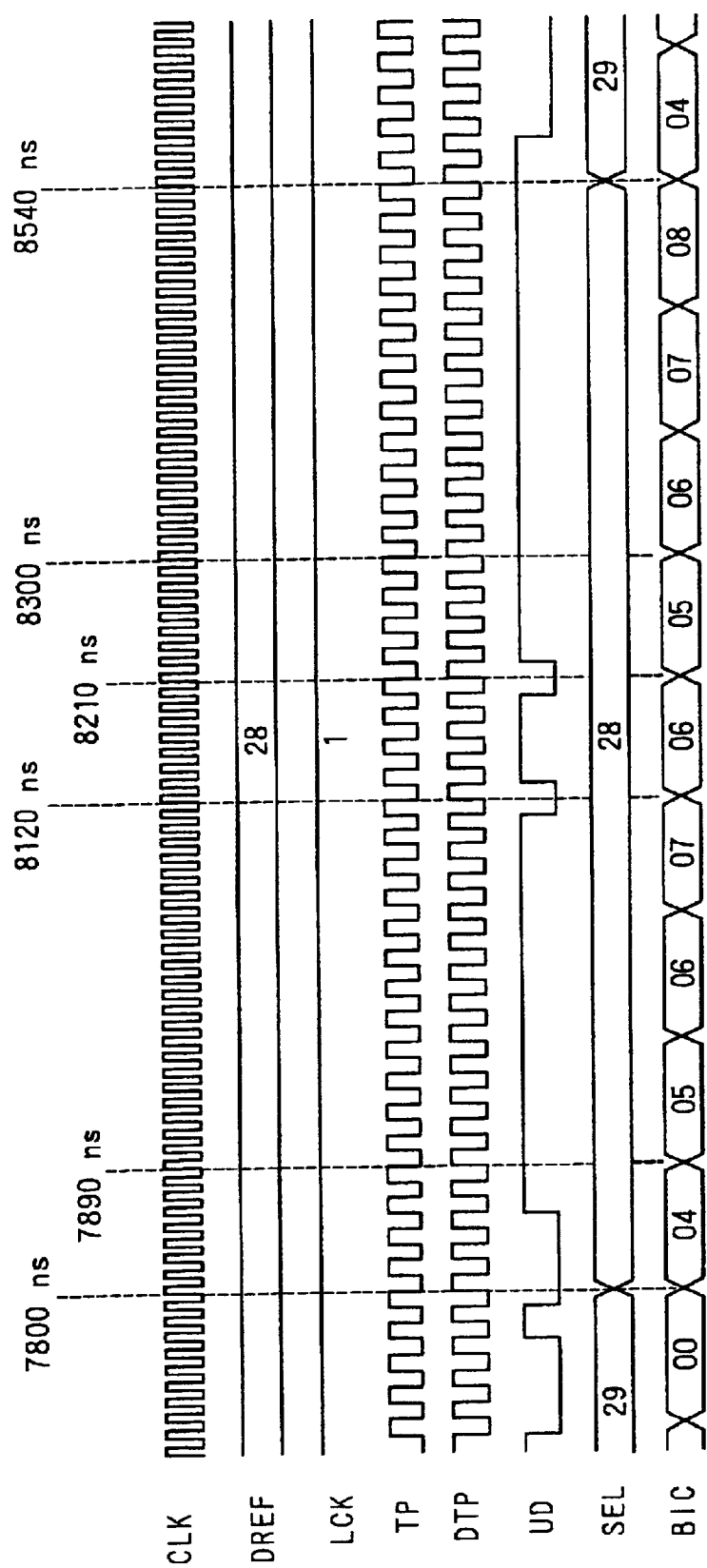
FIG. 5 is a timing chart indicative of the timings of various signals in the delay lock loop circuit shown in FIG. 1 to be presented if a disturbance occurs in the U/D control signal UD.

The following describes the timings of various signals in the delay lock loop circuit 10 which are presented when a disturbance occurs in the U/D control signal UD with reference to FIG. 5. It should be noted that, as with FIG. 4, maximum setting value BIC-MAX, minimum setting value BIC-MIN, and initial setting value BIC-INT in the U/D counter 14 are set to "08," "00," and "04" respectively for example in FIG. 5.

In FIG. 5, during a period up to 7800 ns, count value SEL is "29" and count value BIC has been counted down to "00" of minimum setting value BIC-MIN. At the time of 7800 ns, count value BIC returns to "04" and, at the same time, count value SEL is counted down to "28." Consequently, the amount of delay by the delay line 12 becomes shorter than 1T and the U/D control signal UD outputted from the delay amount detector 13 is turned logically high, upon which count value BIC is counted up during a period between 7890 ns and 8120 ns.

However, before count value BIC becomes "08" of maximum setting value BIC-MAX, a disturbance occurred in the U/D control signal UD at the timing of 8120 ns turns the signal logically low, count value BIC being counted down from "07" to "06." Also, at the next timing of 8210 ns, count value BIC is counted down in the same manner. Thereafter, the U/D control signal UD becomes stable at logically high. During a period between 8300 ns and 8540 ns, count value BIC is normally counted up again. At the timing of 8540 ns, the count value returns to "04" of initial setting value BIC-INT to be counted down.

Such an abnormal counting operation of count value BIC is caused by the inclusion of a short-period noise component into the U/D control signal UD because phase comparison intermediate signal QA is not settled if the rising of data pulse DTP and the inversion of data pulse TP2 inputted in the D-FF 131 of the delay amount detector 13 successively in a period shorter than the minimum setup time and hold time of the D-FF 131. However, in the U/D counter 14, only a change appears in the counting operation of count value BIC when a disturbance occurs in the U/D control signal UD at timings 8120 ns and 8210 ns, count value SEL remaining unchanged as shown in FIG. 5. Namely, counting of count value BIC blocks the high-frequency noise component included in the U/D control signal UD from affecting count value SEL, thereby normally counting count value SEL by alternately taking "28" and "29."

The above-mentioned counting operation by the U/D counter 14 holds delay lock signal LOCK outputted from the delay lock detector 15 at logically high, thereby locking with stability the operation of the delay lock loop circuit 10. Consequently, regardless of an erroneous operation in the D-FF 131 of the delay amount detector 13, the reference delay step count DREF necessary for obtaining a delay of 1T is held constantly, thereby making it practicable to always provide a correct delay amount by use of a delay line configured in the same manner as the delay line 12.

Figure 6:
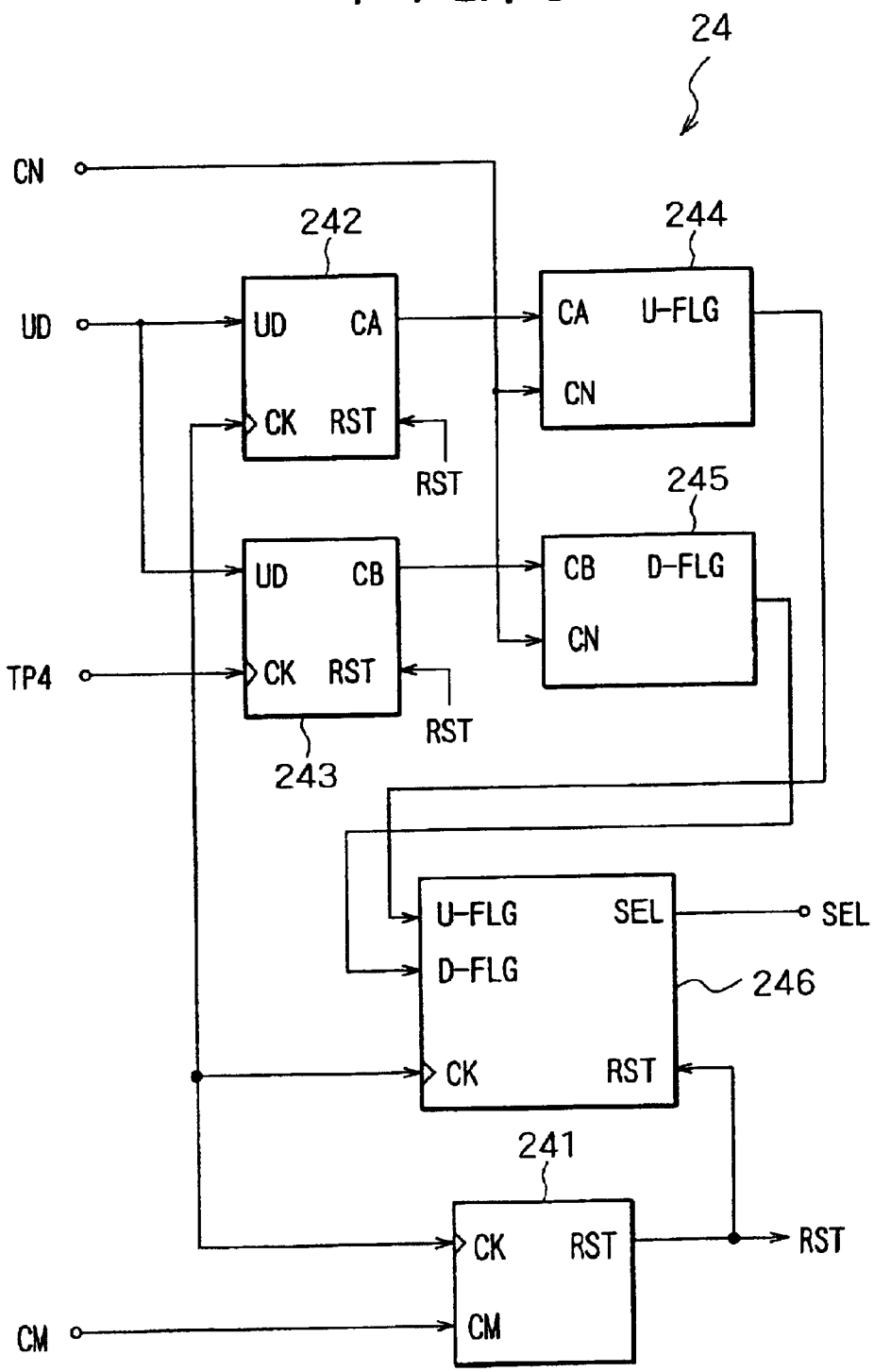
FIG. 6 is a block diagram illustrating a second exemplary configuration of the up/down counter.

It should be noted that the circuit configuration shown in FIG. 3 is only one example. The following describes another embodiment of the U/D counter. FIG. 6 shows a second exemplary configuration of the U/D counter.

The U/D counter 24 shown in FIG. 6 includes a counter 241 which repeatedly counts up until a count value reaches a predetermined value, counters 242 and 243 which counts up on the basis of logically high and logically low respectively of the U/D control signal UD outputted from the delay amount detector 13, comparators 244 and 245 which, if count values CA and CB of the counters 242 and 243 respectively have reached predetermined values, turn logically high flag signals U-FLG and D-FLG to be outputted respectively, and a counter 246 which outputs count value SEL for counting up on the basis of flag signal U-FLG and down on the basis of flag signal D-FLG.

The counter 241, given with setting value CM as a maximum count value beforehand, performs a count-up operation at the rising of data pulse TP4 and, when the count value has reached setting value CM, outputs reset signal RST at the rising of next data pulse TP4 and, at the same time, resets the count value to start counting from zero. Consequently, the counter 241 outputs reset signal RST at constant time intervals.

The counters 242 and 243 are supplied with U/D control signal UD from the delay amount detector 13. If the U/D control signal UD is logically high at the rising of data pulse TP4, the counter 242 counts up count value CA; if the U/D control signal UD is logically low, the counter 242 holds count value CA. If reset signal RST is inputted from the counter 241, the counter 242 resets count value CA at the next rising of data pulse TP4. On the other hand, the counter 243, if the U/D control signal UD is logically low at the rinsing of data pulse TP4, counts up count value CB; if the U/D control signal UD is logically high, the counter 243 holds count value CB. If reset signal RST is inputted from the counter 241, the counter 243 resets count value CB at the next rising of data pulse TP4.

The comparators 244 and 245 are given with setting values CN beforehand. If count value CA outputted from the counter 242 is higher than setting value CN, the comparator 244 turns logically high flag signal U-FLG to be outputted. If count value CB outputted from the counter 243 is higher than setting value CN, the comparator 245 turns logically high flag signal D-FLG to be outputted. The counter 246 detects the states of flag signals U-FLG and D-FLG at inputting of reset signal RST from the counter 241 and, if flag signal U-FLG is logically high, counts up count value SEL at the next rising of data pulse TP4; if flag signal D-FLG is logically high, the counter 246 counts down count value SEL at the next rising of data pulse TP4.

In the above-mentioned U/D counter 24, the counter 246 counts up or down count value SEL only when the number of times the U/D control signal UD goes logically high or low at the rising of data pulse TP4 within a certain period in which reset signal RST is outputted has reached setting value N; if the number of times the U/D control signal UD goes logically high or low is lower than setting value N, count value SEL remains unchanged. Consequently, the high-frequency noise component included in the U/D control signal UD is ignored, thereby outputting count value SEL correctly and with stability.

Figure 7:
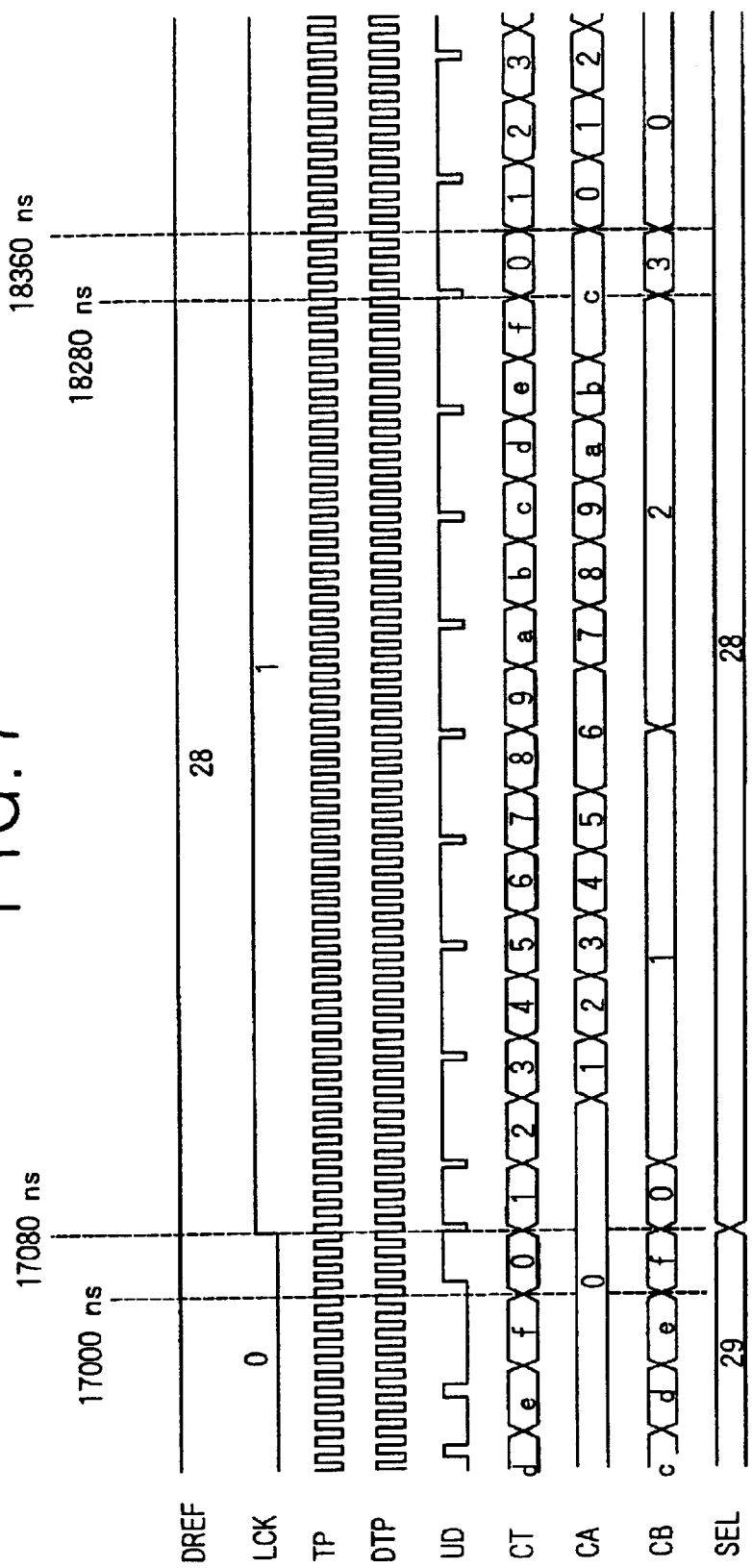
FIG. 7 is a first timing chart indicative of the timings of various signals in the delay lock loop circuit shown in FIG. 1 presented when the up/down counter having the second exemplary configuration shown in FIG. 6 is used.
Figure 8:
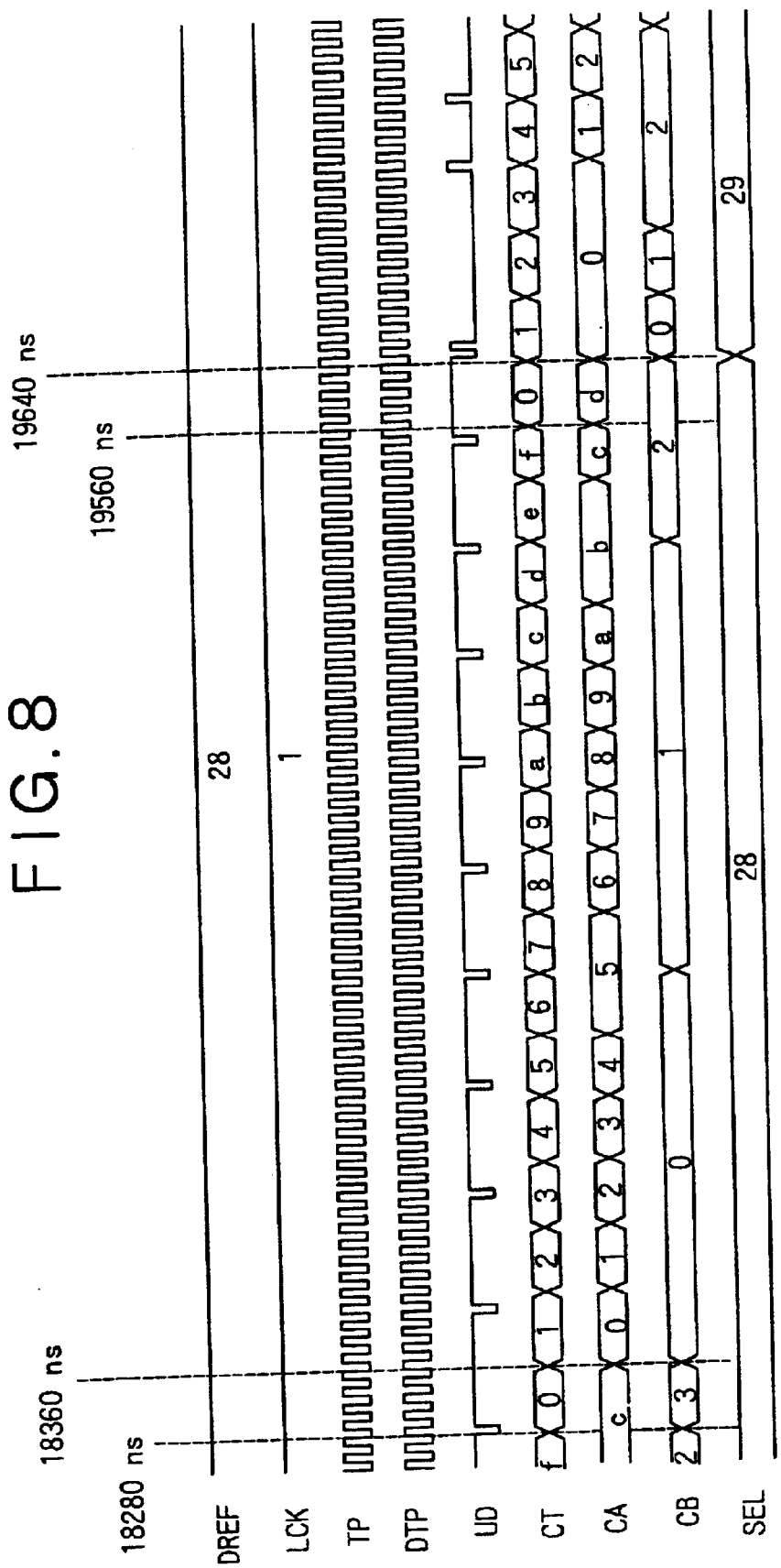
FIG. 8 is a second timing chart indicative of the timings of various signals in the delay lock loop circuit shown in FIG. 1 presented when the up/down counter having the second exemplary configuration shown in FIG. 6 is used.

The following describes the timings of various signals in the delay lock loop circuit 10 having the U/D counter 24 with reference to FIGS. 7 and 8 which illustrate first and second timing examples. It should be noted that FIG. 8 illustrates the timings which are continued from those shown in FIG. 7.

In FIGS. 7 and 8, setting value CM in the U/D counter 24 is set to "f" for example and the counter 241 counts up count value CT from "0" to "f" repeatedly. In addition, "d" is set to the comparators 244 and 245 as setting value N. First, referring to FIG. 7, before the timing of 17000 ns, the U/D control signal UD outputted from the delay amount detector 13 at the rising of data pulse TP4 is almost logically low, count value CB being counted up by the counter 243. At this moment, count value SEL is "29" and reference delay step count DREF is "28" and it is assumed that no locking is performed.

Then, at the timing of 17000 ns, count value CT reaches "0," upon which reset signal RST is outputted from the counter 241. At this moment, count value CB becomes "f" and, because the comparators 245 detects that count value CB is higher than setting value CN, flag signal D-FLG outputted from the comparator 245 is turned logically high, count value SEL is counted down to "28" by the counter 246 at the timing of 17080 ns, which is the next rising of the data pulse TP4. Consequently, the value of reference delay step count DREF is locked to "28" in the delay lock detector 15. At the same time, count values CA and CB obtained by the counters 242 and 243 are reset to "0."

Next, at the rinsing of data pulse TP4, count value CT is counted up. If the U/D control signal UD is logically high at this moment, count value CA is counted up; if it is logically low, count value CB is counted up. Then, at the timing of 18280 ns, count value CT becomes "0." At this moment, count values CA and CB are "c" and "3" respectively and, because both the count values have not reached "d" of setting value CN, flag signals U-FLG and D-FLG inputted in the counter 246 both go logically low, keeping count value SEL unchanged at the timing of 18360 ns at which data pulse TP4 rises.

Referring to FIG. 8, counting up of count value CT starts again from the timing of 18360 ns and, until the timing of 19560 ns, which is the output timing of next reset signal RST, count value CA is counted up at the rising of data pulse TP4 if the U/D control signal UD is logically high; if the U/D control signal UD is logically low, count value CB is counted up. At the timing of 19560 ns, count value CT reaches "0," upon which count value CA reaches "d," so that flag signal U-FLG goes logically high. Consequently, at the timing of 19640 ns at which the next data pulse TP4 rises, count value SEL of counter 246 is counted up to "29." At the same time, count values CA and CB of the counters 242 and 243 respectively are reset to "0" again.

In the above-mentioned U/D counter 24, if the delay amount detector 13 which outputs the U/D control signal UD operates normally, count value SEL of the counter 246 alternately takes "28" and "29" in general. In FIGS. 7 and 8, during a period between 17000 ns and 18280 ns, the disturbance in the U/D control signal UD caused by a malfunction of the delay amount detector 13 is absorbed by the count-up operations of both count values CA and CB. Consequently, the high-frequency noise component included in the U/D control signal UD is blocked from affecting count value SEL to keep count value SEL at "28" without change until the timing of 19640 ns, thereby providing a normal counting operation to lock reference delay step count DREF with stability.

Figure 9:
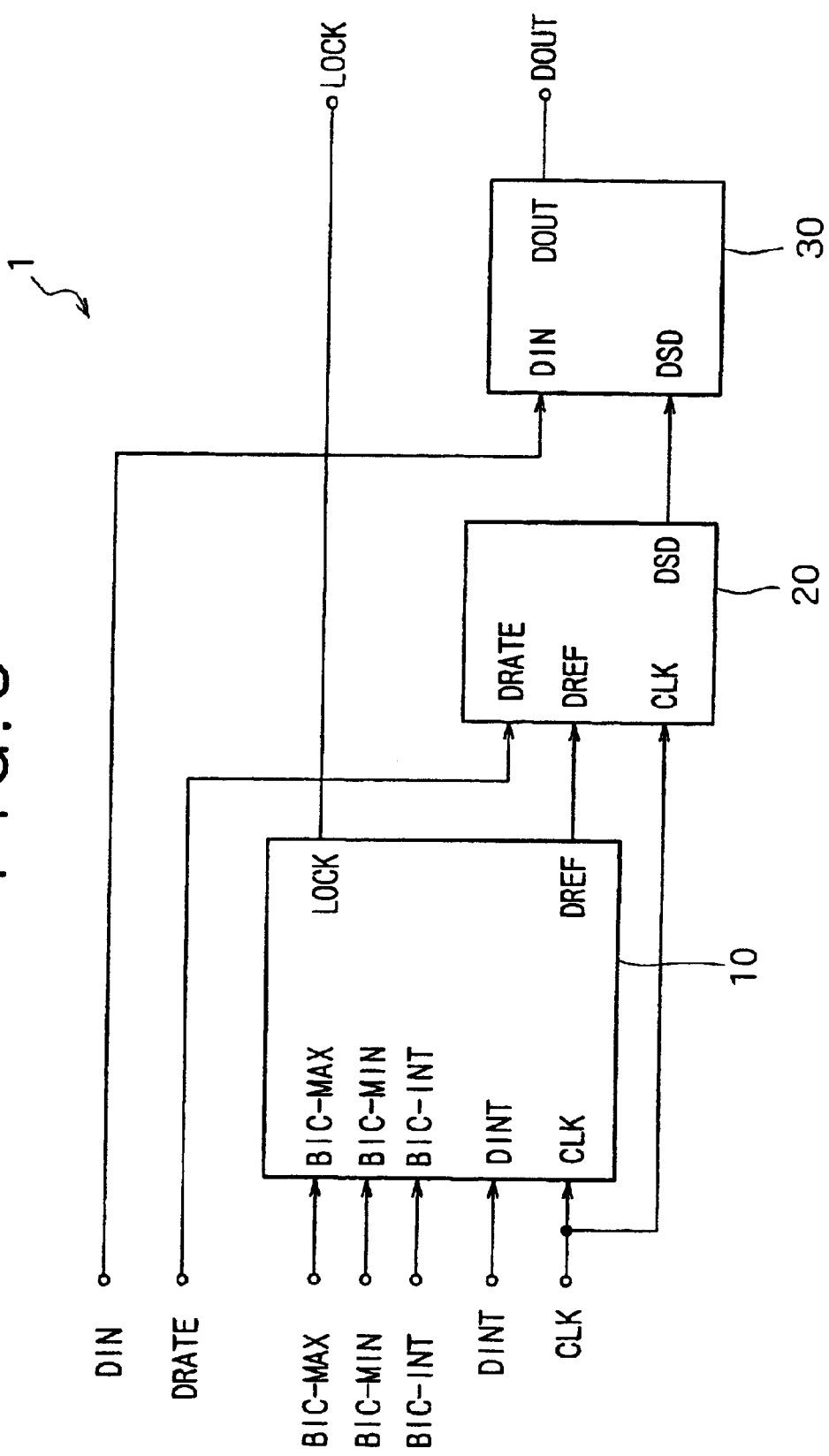
FIG. 9 is a block diagram illustrating an exemplary configuration of a variable delay circuit configured by use of the delay lock loop circuit shown in FIG. 1.

The following describes an exemplary configuration of a variable delay circuit constituted by use of the above-mentioned delay lock loop circuit 10 with reference to FIG. 9.

A variable delay circuit 1 shown in FIG. 9 includes the delay lock loop circuit 10 shown in FIG. 1, a delay step count setter 20 for setting the number of delay steps so as to provide a desired delay amount, and a delay line 30 for delaying an input signal by the number of delay steps set by the delay step count setter 20. The delay lock loop circuit 10 has one of the U/D counter 14 shown in FIG. 3 or the U/D counter 24 shown in FIG. 6 and outputs reference delay step count DREF for delaying an input signal by 1T through the delay line 30 to the delay step count setter 20. The delay step count setter 20 receives delay rate DRATE for a delay amount of 1T, multiplies the delay rate DRATE by reference delay step count DREF, and outputs the multiplication result as delay step count DSD. The delay line 30 is similar in configuration to the delay line 12 of the delay lock loop circuit 10 such that unit delay elements each formed by connecting two inverters in series are connected in series for multiple steps for example. For example, the delay line 30 is formed on a same chip on which the delay line 12 is formed. The delay line 30 delays input data DIN on the basis of delay step count DSD set by the delay step count setter 20.

Consequently, in the variable delay circuit 1, the delay step count setter 20 can set the delay amount in the delay line 30 for input data DIN as required. At this moment, if the operation of the delay lock loop circuit 10 causes the delay amount in the delay line 30 to fluctuate due to a fluctuation in temperature or supply voltage or process conditions, reference delay step count DREF varies in accordance with this fluctuation to correctly provide a desired delay amount. In addition, if the U/D control signal UD outputted from the delay amount detector 13 of the delay lock loop circuit 10 irregularly fluctuates in a short period, a correct delay amount can be provided with stability regardless of this fluctuation, making it especially effective for a situation in which a minute delay amount as compared with clock period T must be correctly provided. The variable delay circuit 1 and the delay lock loop circuit 10 as described above can be implemented by a CMOS logic circuit process including the delay lines 30 and 12. Therefore, the variable delay circuit 1 of high reliability and the delay lock loop circuit 10 of high reliability can be realized without increasing fabrication cost, packaging area, and power dissipation.

Figure 10:
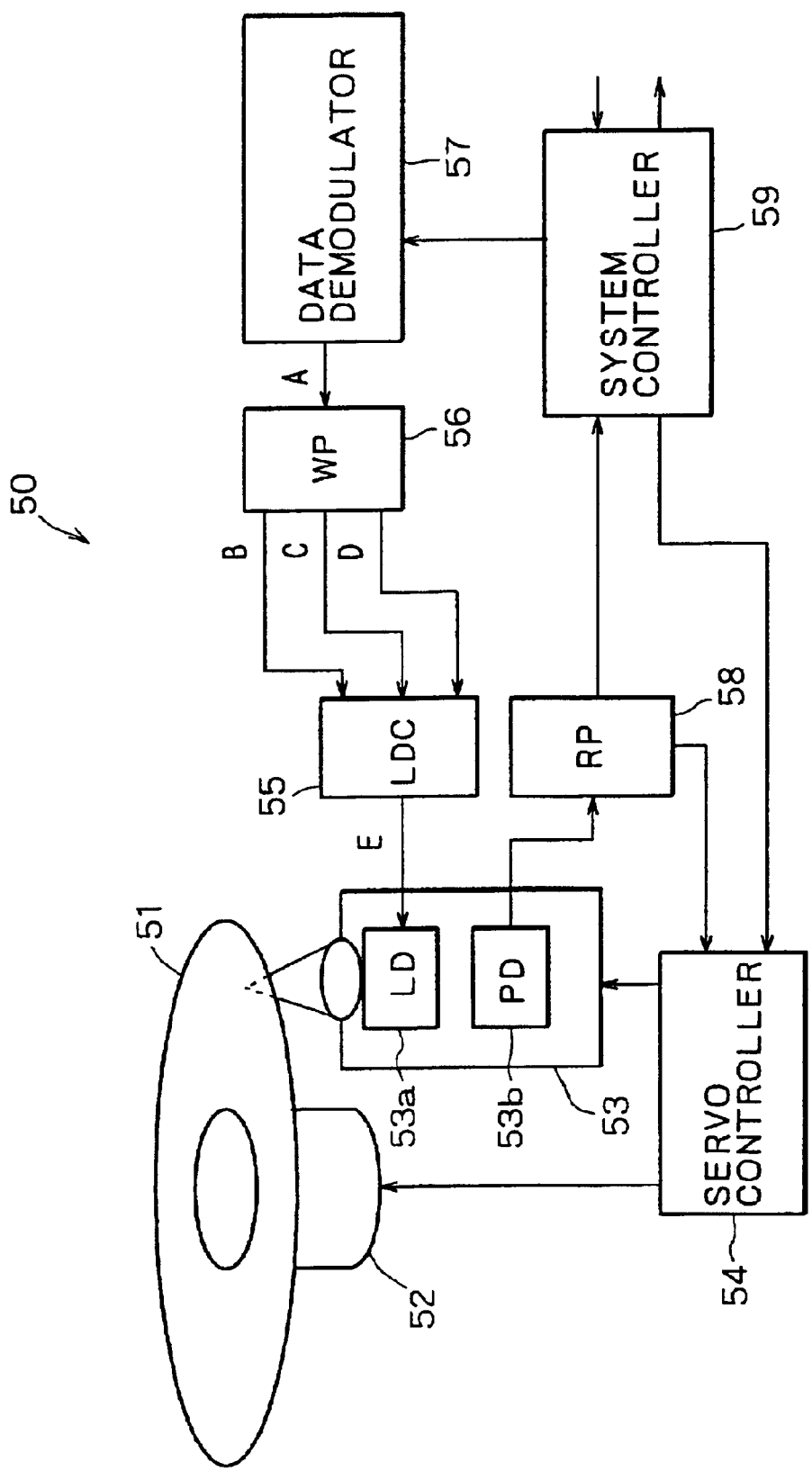
FIG. 10 is a schematic diagram illustrating an optical disk apparatus configured by use of the variable delay circuit shown in FIG. 9.

The following describes a particular usage example of the above-mentioned variable delay circuit 1. Referring to FIG. 10, there is shown a schematic diagram illustrating an optical disk apparatus based on the variable delay circuit 1.

An optical disk apparatus 50 shown in FIG. 10 performs data recording and reproduction on an optical disk 51 on the basis of so-called phase change recording. The optical disk apparatus 50 includes a spindle motor 52 for rotatively driving the optical disk 51, an optical head 53 having a laser diode (hereafter referred to an LD) 53a for irradiating a laser beam to the signal recording surface of the optical disk 51 and a photo detector (hereafter referred to as a PD) for receiving the reflected light from the optical disk 51, a servo controller 54 for controlling the rotation of the spindle motor 52 and the movement of the optical head 53, a laser diode controller (hereafter referred to as an LDC) 55 for controlling the output of the laser beam from the LD 53a, a write processor (hereafter referred to as a WP) 56 for generating various control signals including recording pulses, a data demodulator 57 for demodulating recording signals, a read processor (hereafter referred to as an RP) 78 for modulating an output signal from the PD 53b, and a system controller 59 for encoding and decoding recording signals and reproduction signals and controlling the entire optical disk apparatus 50.

In the optical disk apparatus 50, when reproducing the optical disk 51, the spindle motor 52 is rotatively driven by the control of the system controller 59 through the servo controller 54 to move the optical head 53 to a predetermined position, upon which a laser beam of reproduction level is irradiated from the LD 53a to the optical disk 51. The laser beam is reflected from the recording surface of the optical disk 51 to be received by the PD 53b and amplified and demodulated by the RP 78. On the basis of the demodulated signal from the RP 78 and the control signal from the system controller 59, the servo controller 54 performs the rotational speed control of the spindle motor 52 and the tracking control of the movement of the optical head 53 and the focus control of the optical head 53. On the other hand, the system controller 59 performs demodulation based on NRZI (Non Return to Zero Inverted) for example, decoding, and error correction on the demodulated signal supplied from the RP 78 and outputs a resultant reproduction signal.

In the optical disk apparatus 50, when recording signals to the optical disk 51, the data modulator 57 performs demodulation based on NRZI for example on the recording signal to which predetermined encoding and the like has been performed by the system controller 59 and signals including the resultant modulated signal are supplied to the LDC 55. On the basis of the supplied signals, the LDC 55 drives the LD 53a, upon which a laser beam is irradiated to the signal recording surface of the optical disk 51 for a recording operation. Referring to FIG. 11, there is shown signal and current waveforms to be outputted at signal recording, where the output from the data modulator 57 is recording data A, the output signals of the WP 56 are reading control signal B, recording control signal C, and recording pulse D, and the drive current of the LD 53a by the LDC 55 is drive current E.

In FIG. 11, recording data A are obtained by performing encoding and modulation based on NRZI for example on a signal to be recorded; namely, recording data A indicate a mark which is ideally formed on the optical disk 51. Reading control signal B is used to irradiate a laser beam to the optical disk 51 until the signal is written to the optical disk 51. The laser beam irradiated on the basis of this signal and reflected from the optical disk 51 is received by the PD 53b to detect the write position of the signal. Then, a laser beam on based on a signal obtained by combining recording control signal C and recording pulse D is irradiated, starting signal writing.

In a writing operation with a phase change optical disk, it is very important to properly perform thermal control on the disk recording surface in order to form correct marks. Hence, at the time of recording, drive current E based on a signal obtained by combining recording control signal C for providing DC bias to the LD 53a and recording pulse D obtained by modulating input data is supplied to the LD 53a. As shown in FIG. 11 for example, recording pulse D is obtained by modulating recording data A such that the pulse leading edge is delayed to provide a pulse train synchronized with clock after the leading pulse. By this, so-called recording compensation is performed. Recording compensation is required to correctly form the width and length of each mark on the recording surface especially at recording to high-recording-density phase change optical disks. Recording compensation is executed by varying a laser beam to be irradiated to control the temperature on the laser irradiated surface.

To be more specific, recording compensation is executed by a signal waveform generating method represented by an expression (1) or (2) shown below. In these methods where recording pulse D is used for example, if the pulse width for one clock is T, then, in order to form a mark having length nT (n being an integer), the laser diode is driven by recording pulse D1 or D2 represented in expressions (1) or (2) to perform signal recording.

$$xS+(1.5-x)M+(n-2)(0.5S+0.5M)+yM+(0.5-y)S \qquad (1)$$

$$xS+(1.5-x)M+(n-3)(0.5S+0.5M)+0.5S+yM+(1-y)S \qquad (2)$$

where, M is a high-level mark having length T, S is a low-level space having length T, and x, y, z are delay amounts.

In recording pulses D1 and D2 in the above-mentioned expressions (1) and (2), the leading edge and the trailing edge of the entire pulse are delayed by x and y respectively to perform recording compensation so that a mark is correctly formed. Also, recording compensation may be performed by controlling the duty ratio of a burst pulse represented by (0.5S+0.5M) in the expressions (1) and (2), for example.

Figure 12A:
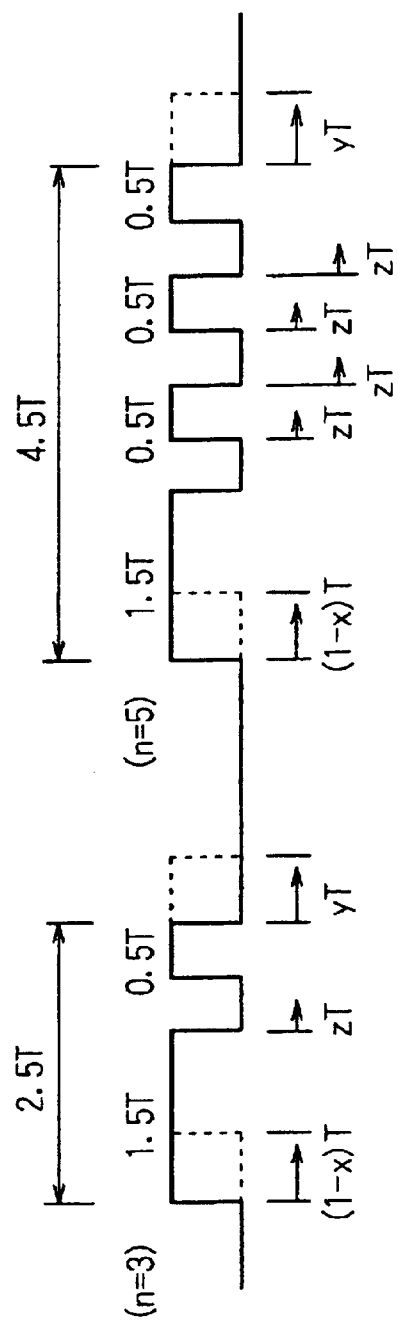
FIG. 12A and FIG. 12B illustrate examples of waveforms of recording pulses at recording compensation.
Figure 12B:
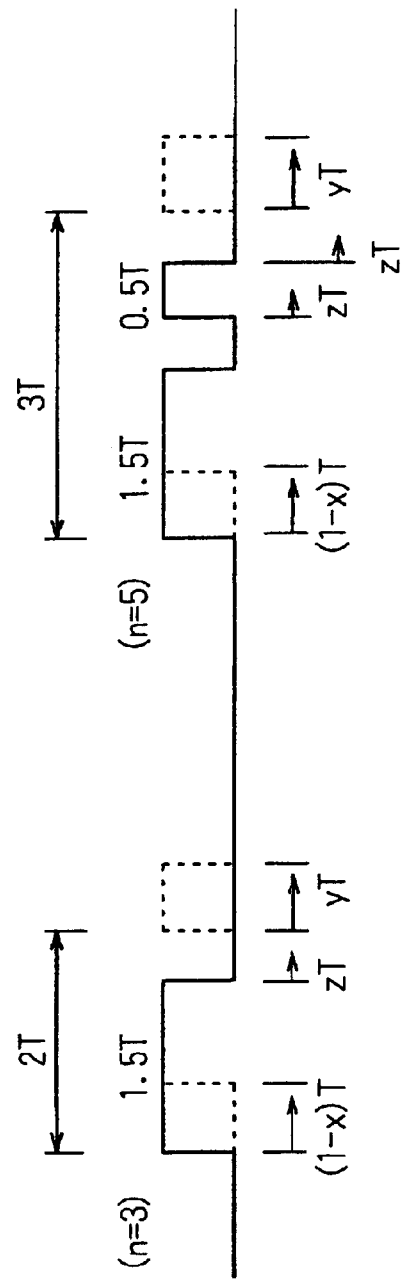

Referring to FIGS. 12A and 12B, there is shown the waveforms of recording pulses when recording compensation is performed by use of the above-mentioned expressions (1) and (2) FIG. 12A shows the waveform of recording pulse D1. FIG. 12B shows the waveform of recording pulse D2.

If x=y=0 in expression (1), then, as shown with solid lines in FIG. 12A, recording pulse D1, if its length is 3T, namely n=3, is a pulse train in which a 1.5T high is followed by a 0.5T space followed by a 0.5T high. If its length is 5T, namely n=5, a 1.5T high is followed by a 0.5T low and a 0.5T high which alternately appear three times. By these pulse trains, the LD 53a is driven. Likewise, if x=y=0 in expression (2), as shown with solid lines in FIG. 12B, recording pulse D2 consists of only a 1.5T high if n=3 for example; if n=5, recording pulse D2 is a pulse train in which a 1.5T high is followed by a 0.5T space followed by a 0.5T high. If a value of x is set, the rising position of the leading edge of each pulse is delayed in accordance with the value of x. If a value of y is set, the falling position of the trailing edge of each pulse is delayed in accordance with the value of y in the case of recording pulse D1 in expression (1); in the case of recording pulse D2 in expression (2), a pulse in accordance with the value of y is formed 0.5T after the training edge.

In addition to the recording compensation performed by recording pulses D1 and D2 in expressions (1) and (2) respectively, another recording compensation may be performed in which, as with a delay in accordance with the value of delay amount z shown in FIGS. 12A and 12B for example, the leading edge or trailing edge of a burst pulse having 0.5T pulse width is delayed.

Generation of recording pulses D1 and D2 for performing the above-mentioned recording compensation can be realized by a logic circuit using a multiple-step shift register for example. In such a logic circuit, pulse variations due to the setting of x, y, and z can be realized by a variable delay circuit to which a delay amount can be set as required. Especially, in the case of the optical disk apparatus 50 of high recording density, minute delay amounts for clock period are required. In order to correctly obtain minute delays, the variable delay circuit 1 shown in FIG. 9 is used.

Figure 13:
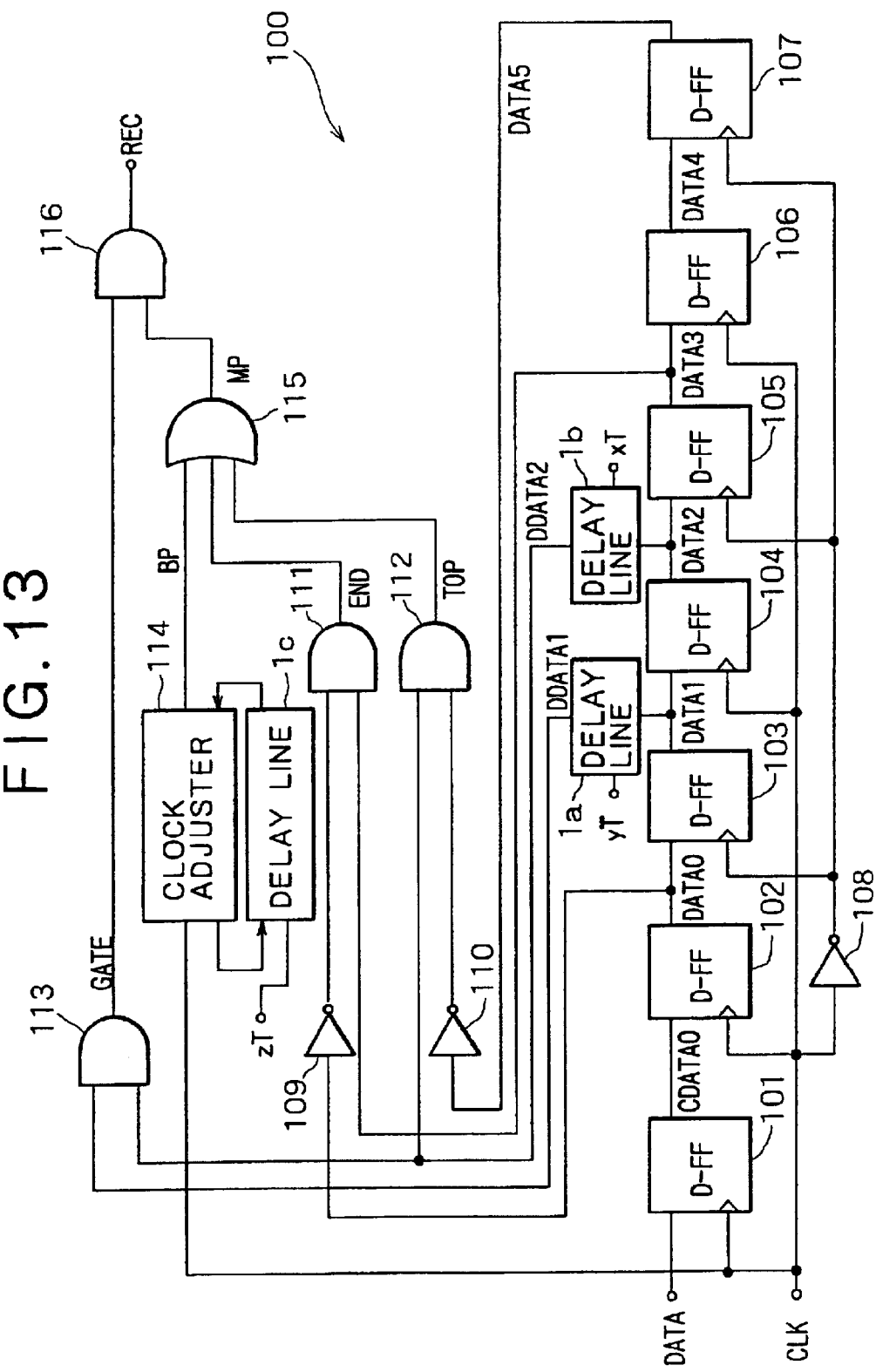
FIG. 13 is a circuit diagram illustrating an exemplary configuration of a recording signal compensating circuit for generating recording pulse.

FIG. 13 shows an exemplary configuration of a recording signal compensating circuit 100 for performing recording compensation by generating recording pulse D1 in accordance with expression (1) above. It should be noted that the recording signal compensating circuit 100 includes both the configuration for generating recording pulse D1 in accordance with expression (1) and the configuration for delaying the leading edge or trailing edge position of a burst pulse described above.

The recording signal compensating circuit 100 shown in FIG. 13 includes D flip-flops (hereafter referred to as D-FFs) 101, 102, 103, 104, 105, 106, and 107 constituting a multiple-step shift register for input data DATA, an inverter 108, delay lines 1a and 1b for delaying outputs from the D-FF 103 and the D-FF 104 by a required amount, inverters 109 and 110 for inverting the output from the shift register, AND gates 111, 112, and 113, a clock adjuster 114 for adjusting the pulse width of clock CLK by use of a delay line 1c, an OR gate 115 for the outputs from the AND gates 111 and 112 and the clock adjuster 114, and an AND gate 116 providing the output stage of the recording signal compensating circuit 100.

The D-FF 101 generates CDATA0 obtained by latching input data DATA at the rising of clock CLK. The D-FFs 102 through 107 generate data pulses DATA0, DATA1, DATA2, DATA3, DATA4, and DATA5 respectively which are delayed by 0.5T with reference to CDATA0. It should be noted that input data DATA are equivalent to recording data A shown in FIG. 11. The delay lines 1a and 1b are configured in the same manner as those in the variable delay circuit 1 shown in FIG. 9 and output data pulses DDATA1 and DDATA2 which are delayed by amounts corresponding to the values of y and x set as required. The AND gate 112 performs a logic AND operation between the inverse phase of data pulse DATA5 and data pulse DDATA2 to output leading pulse TOP. The AND gate 111 performs a logic AND operation between the inverse phase of data pulse DATA0 and data pulse DATA3 to output trailing pulse END. The AND gate 113 performs a logic AND operation between DDATA1 and DDATA2 to output data pulse GATE.

The delay line 1C is configured in the same manner as that in the variable delay circuit 1 shown in FIG. 9. The clock adjuster 114 outputs burst pulse BP obtained by performing a logic OR or logic AND operation between clock CLK and a pulse obtained by delaying clock CLK in the delay line 1c by an amount corresponding to the value of z set as required. The OR gate 115 outputs data pulse MP by performing a logic OR operation between leading edge pulse TOP, trailing edge pulse END, and burst pulse BP. The AND gate 116 outputs recording pulse REC by performing a logic AND operation between data pulse MP and GATE. It should be noted that the recording pulse REC is equivalent to recording pulse D shown in FIG. 11.

Figure 14:
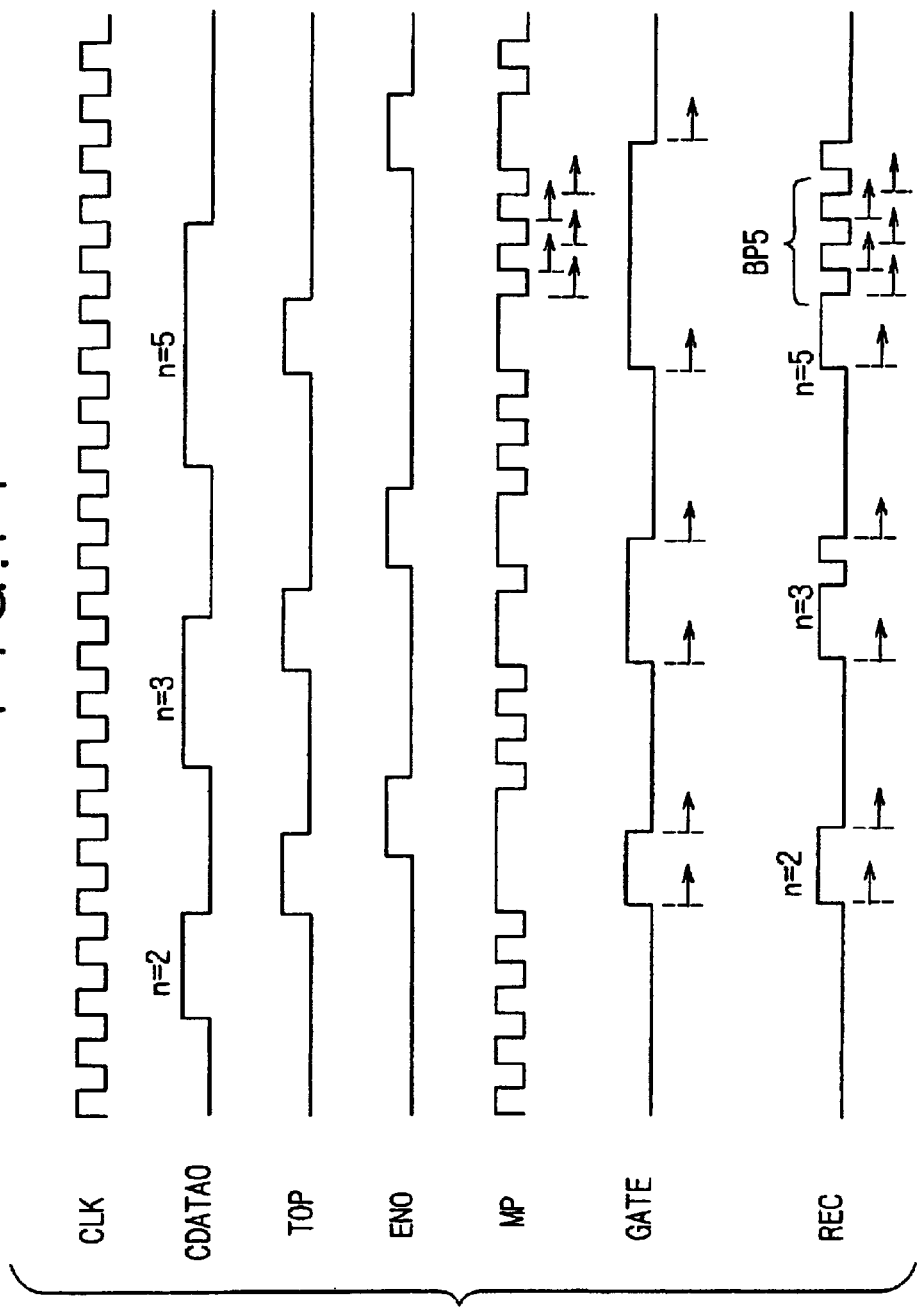
FIG. 14 is a timing chart indicative of various signals in the recording signal compensating circuit shown in FIG. 13.
Figure 15:
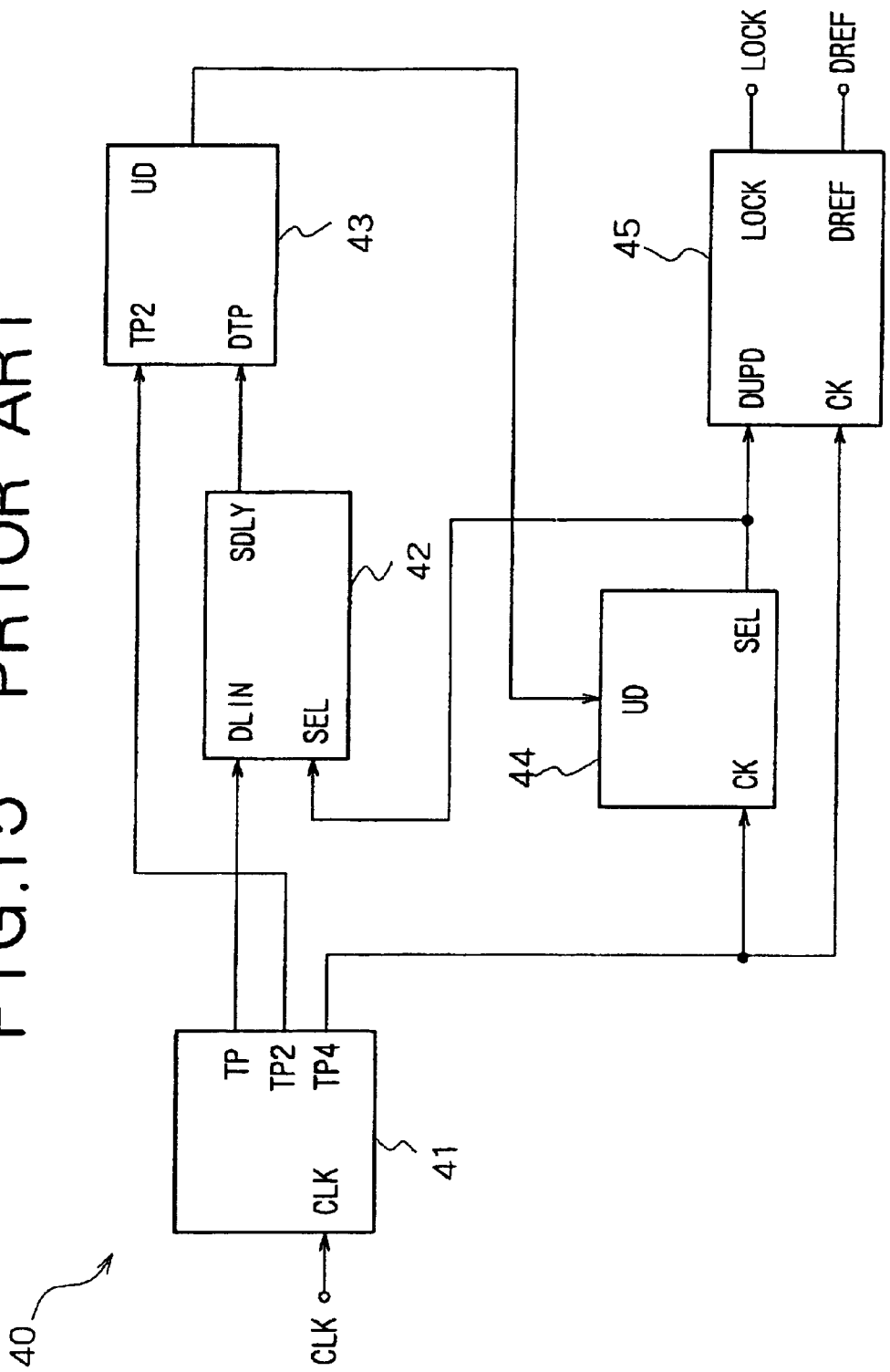
FIG. 15 is a block diagram illustrating an exemplary configuration of a delay lock loop circuit used in a prior art variable delay circuit.
Figure 16:
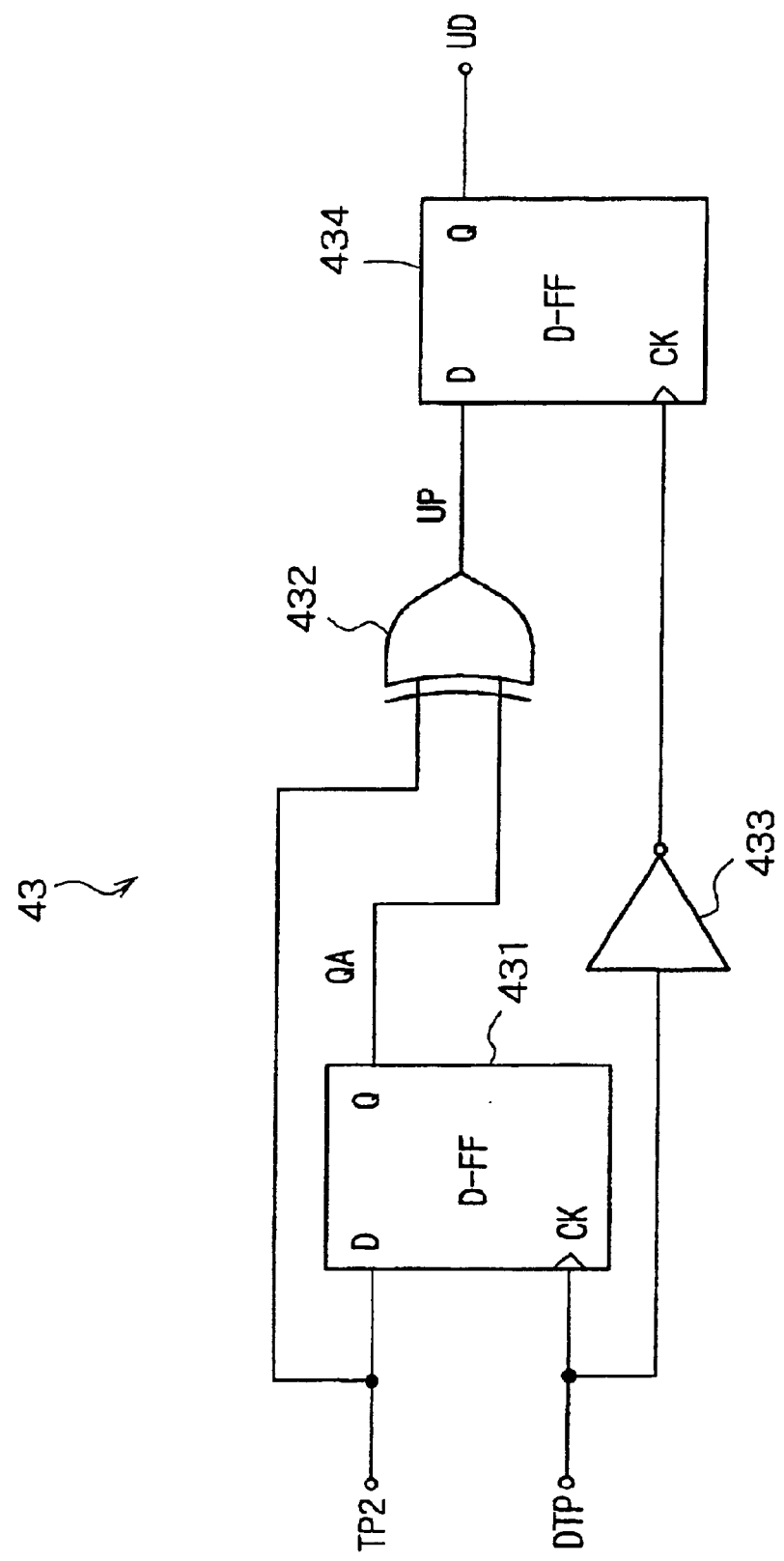
FIG. 16 is a circuit diagram illustrating an exemplary circuit configuration of a prior art delay amount detector.
Figure 17:
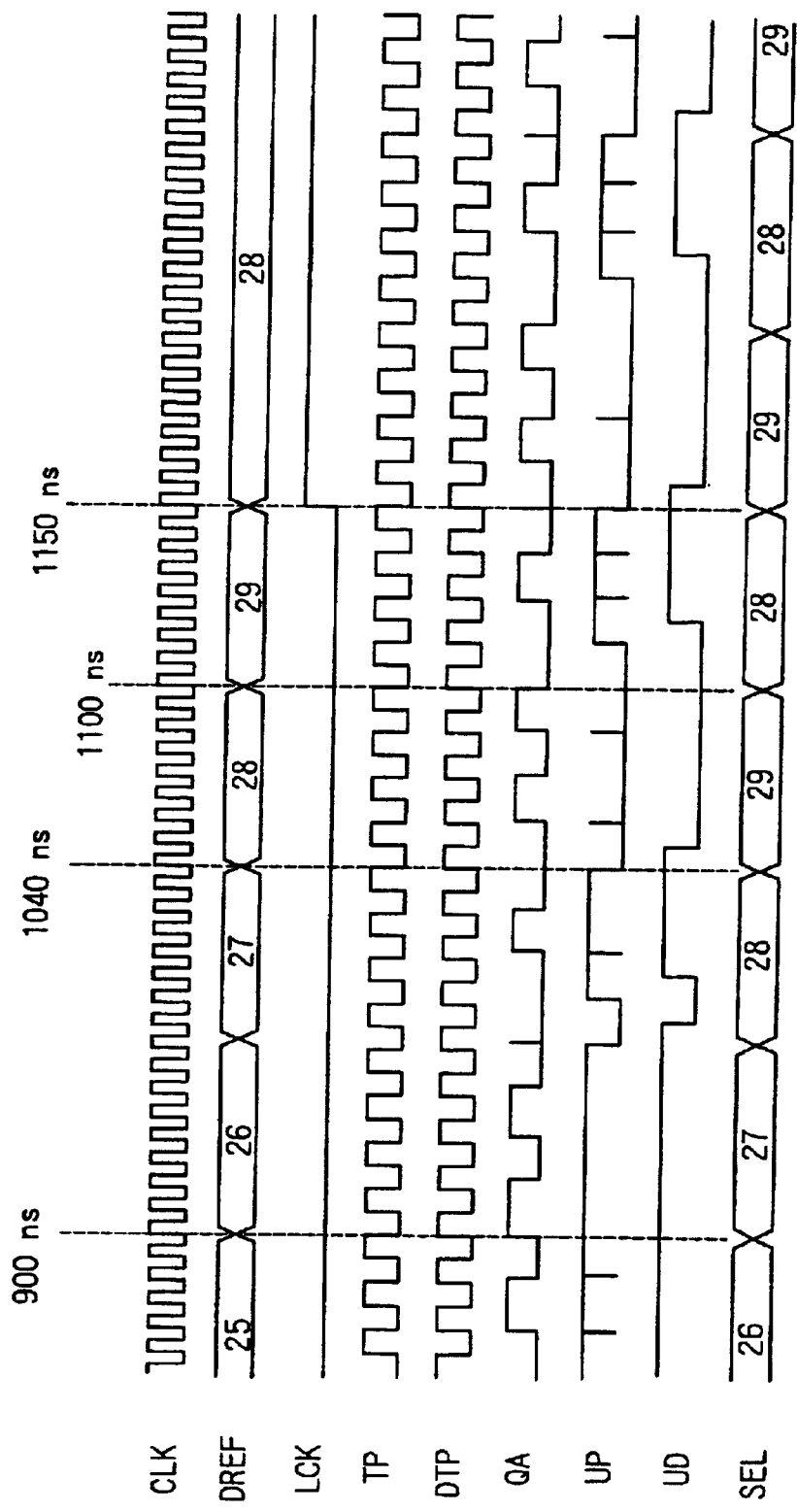
FIG. 17 is a timing chart indicative of various signals in the prior art delay lock loop circuit shown in FIG. 15; and FIG, 18 is a timing chart indicative of various signals in the prior art delay lock loop circuit shown in FIG. 15 to be presented when an abnormal operation takes place.
Figure 18:
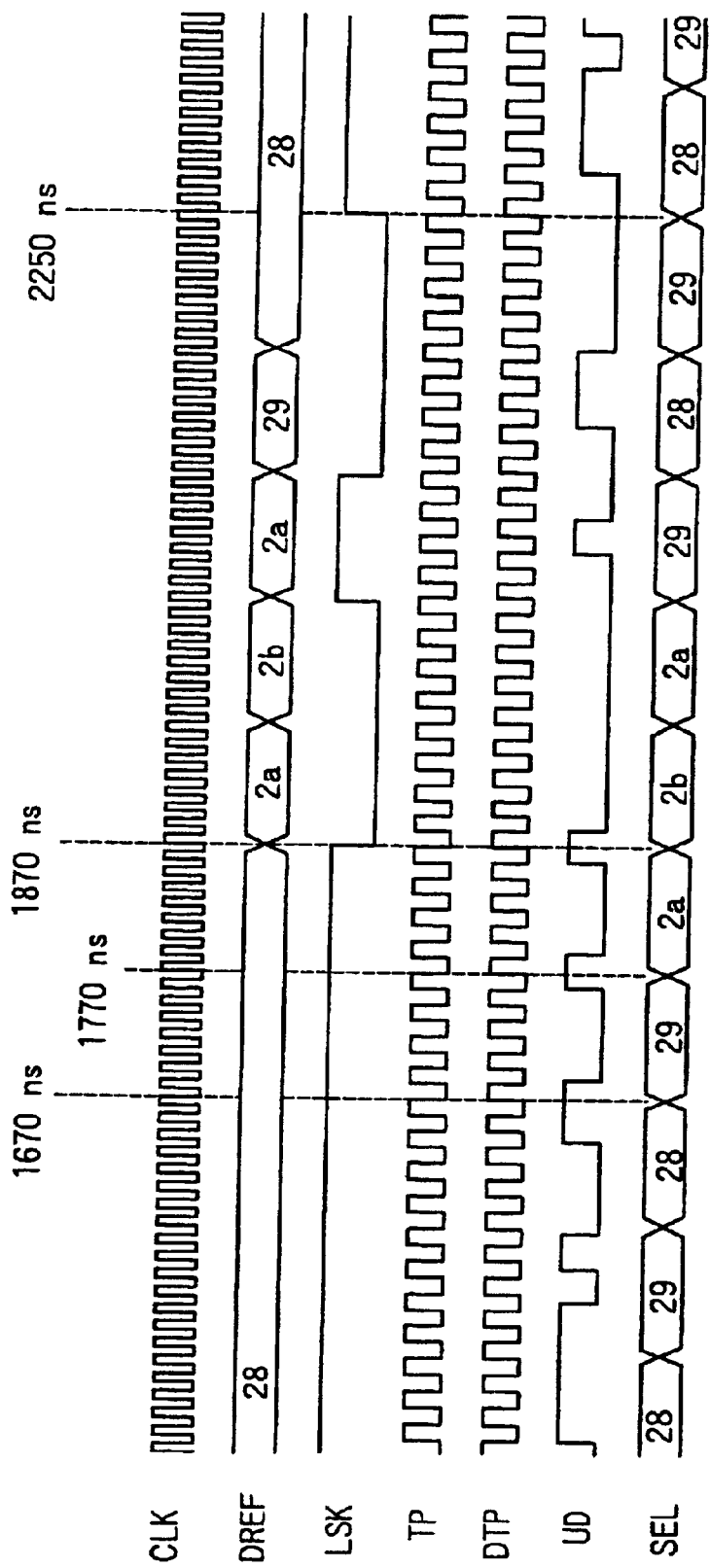

The following describes the timings of various signals in the recording signal compensating circuit 100 with reference to FIG. 14.

FIG. 14 shows signals with the length of input data DATA namely recording pulse D being 2T, 3T, and 5T namely n=2, 3, and 5, for example. Further, in the signals shown, the delay amount in the delay lines 1a, 1b, and 1c is 0, namely x=y=z=0. As shown in FIG. 14, the leading pulse TOP and the trailing pulse END outputted from the AND gates 112 and 111 are both 1.5T in length. In the OR gate 115, these pulses are combined with burst pulse BP to provide data pulse MP. In the AND gate 116, the leading edge and trailing edge of the data pulse MP are determined by data pulse GATE, thereby generating recording pulse REC. As a result, if n=2, recording pulse REC is 1.5T long; if n=3, recording pulse REC provides a pulse train in which a 1.5T high is followed by a 0.5T space followed by a 0.5T high. If the length is 5T, namely n=5, recording pulse REC provides a pulse train in which a 1.5T high is followed by a 0.5T low and a 0.5T high which alternately appear three times.

If delay amounts y and x are set to the delay lines 1a and 1b respectively, the positions of the trailing edge and leading edge of data pulse GATE are delayed in accordance with the values y and x, thereby delaying the positions of the trailing edge and leading edge of recording pulse REC. Further, if delay mount z is set to the delay line 1c, the position of the leading edge or trailing edge of a clock pulse component present in recording pulse REC, namely burst pulse BP5 indicated in recording pulse REC of n=5 for example, is delayed in accordance with the value of delay amount z. For example, if a logic AND operation is performed between a signal which has passed the delay line 1c and clock CLK in the clock adjuster 114, the position of the leading edge of burst pulse BP5 is delayed; if a logic OR operation is performed, the position of the trailing edge of burst pulse BP5 is delayed.

As described and according to the invention, each of the delay lines 1a, 1b, and 1c, constituted by the variable delay circuit 1 shown in FIG. 9, can correctly provide a desired minute delay amount regardless of the fluctuation in the delay amount in any delay element having the same configuration in each of these delay lines 1a, 1b and 1c due to the fluctuation in temperature or supply voltage or process conditions for example. Therefore, in the recording compensation indispensable for signal writing to phase change optical disks, the irradiation of a laser beam can be correctly controlled in a period shorter than clock CLK, thereby realizing a circuit for performing highly reliable recording compensation without increasing the production cost, packaging area, and power dissipation.

In FIG. 13, a circuit for generating recording pulse D1 in the method based on expression (1) above is shown. In order to generate recording pulse D2 in the method based on expression (2), the input into the delay line 1a may be changed from the output of the D-FF 103 to the output of the D-FF 102 and the input into the AND gate 113 may be changed to the output of the D-FF 104 and the output of the delay line 1a for example with reference to FIG. 13.

While the preferred embodiments of the present invention have been described using specific terms, such description is for illustrative purposes only, and it is to be understood that changes and variations may be made without departing from the spirit or scope of the appended claims.

What is claimed is:

1. A delay lock loop circuit comprising:

a dividing means for generating, on a clock signal, first pulse data, second pulse data having a period greater than that of said first pulse data, and third pulse data having a period greater than that of said second pulse data;

an up/down counter having a sub counter, to a count value of which an initial value, a maximum value, and a minimum value are set, said sub counter executing at least one of a count-up operation and a count-down operation on the basis of up/down control signal at a rising edge of said third pulse data and, when said count value has reached said maximum value and said minimum value, setting a next count value to said initial value, said up/down counter executing a count-up operation at a rising edge of said third pulse data when said count value of said sub counter is said maximum value and a count-down operation when said count value is said minimum value;

a delay means for delaying said first pulse data in accordance with the number of delay steps based on a count output of said up/down counter;

a delay amount detecting means for determining which of a rising edge of said second pulse data and a rising edge of an output pulse of said delay means comes first and outputting, on the basis of a result of this determination, said up/down control signal; and a delay lock detecting means for comparing a current count value with a past count value of said up/down counter at a rising edge of said third pulse data to determine whether or not a delay amount is locked, selecting one of said current count value and said past count value, and outputting the selected count value as a reference delay step count.

2. The delay lock loop circuit according to claim 1, wherein said sub counter comprising:

a latch means for latching supplied data at a rising edge of said third pulse data;

an adding means for adding 1 to a latch data value supplied from said latch means;

a subtracting means for subtracting 1 from said latch data value;

a first comparing means for, when said latch data value is equal to said maximum value, outputting a first reset signal indicative thereof;

a second comparing means for, when said latch data value is equal to said minimum value, outputting a second reset signal indicative thereof;

a first selector for selectively outputting, on the basis of said up/down control signal, data supplied from said adding means and said subtracting means; and a second selector supplying, to said latch means, said initial value when one of first reset signal and second reset signal is supplied and the output data of said first selector in any other cases.

3. A delay lock loop circuit comprising:

a dividing means for generating, on a clock signal, first pulse data, second pulse data having a period greater than that of said first pulse data, and third pulse data having a period greater than that of said second pulse data;

an up/down counter having a first counter for executing a count-up operation at a rising edge of said third pulse data and, when a count value has exceeded a preset value M (an integer higher than 0), outputting a reset signal and resetting said count value, a second counter for executing a count-up operation only when an up/down control signal is logically high at a rising edge of said third pulse data and resetting a count value when said reset signal is inputted, and a third counter for executing a count-up operation only when said up/down control signal is logically low at a rising edge of said third pulse data and resetting a count value when said reset signal is inputted, said up/down counter executes, when said reset signal is inputted, a count/up operation when the count value obtained by said second counter is higher than preset value N (an integer higher than 0 and lower than M) and a count-down operation when the count value obtained by said third counter is higher than said preset value N;

a delay means for delaying said first pulse data in accordance with the number of delay steps based on a count output of said up/down counter;

a delay amount detecting means for determining which of a rising edge of said second pulse data and a rising edge of an output pulse of said delay means comes first and outputting, on the basis of a result of this determination, said up/down control signal; and a delay lock detecting means for comparing a current count value with a past count value of said up/down counter at a rising edge of said third pulse data to determine whether or not a delay amount is locked, selecting one of said current count value and said past count value, and outputting the selected count value as a reference delay step count.

4. The delay lock loop circuit according to claim 3, wherein said up/down counter further comprising:

a first comparing means for, when the count value obtained by said second counter is higher than said preset value N, turning logically high a first flag signal to be outputted;

a second comparing means for, when the count value obtained by said third counter is higher than said preset value N, turning logically high a second flag signal to be outputted; and a fourth counter for, when said first flag signal is logically high when said reset signal is inputted, executing a count-up operation at a rising edge of said third pulse data and, when said second flag signal is logically high, executing a count-down operation at the rising edge of said third pulse data.

* * * * *